United States Patent
Yuda

Patent Number: 6,118,139
Date of Patent: Sep. 12, 2000

[54] THIN FILM TRANSISTOR WITH REDUCED HYDROGEN PASSIVATION PROCESS TIME

[75] Inventor: Katsuhisa Yuda, Tokyo, Japan

[73] Assignee: NEC Corporation, Tokyo, Japan

[21] Appl. No.: 09/207,156

[22] Filed: Dec. 8, 1998

[30] Foreign Application Priority Data

Dec. 9, 1997 [JP] Japan ................................ 9-339037

[51] Int. Cl.⁷ ................................................ H01L 29/00
[52] U.S. Cl. ............................ 257/59; 257/347; 257/348; 257/349; 257/350; 257/351; 257/352; 257/353; 257/751
[58] Field of Search ..................... 257/347–353, 257/751, 59

[56] References Cited

U.S. PATENT DOCUMENTS

| 4,141,022 | 2/1979 | Sigg et al. ........................ 257/751 |
| 5,739,549 | 4/1998 | Takamura et al. ............... 257/347 |

FOREIGN PATENT DOCUMENTS

| 63-119270 | 5/1988 | Japan . |
| 64-53553 | 3/1989 | Japan . |
| 5-55521 | 3/1993 | Japan . |
| 6-77484 | 3/1994 | Japan . |
| 6-314697 | 11/1994 | Japan . |
| 7-14849 | 1/1995 | Japan . |
| 7-38118 | 2/1995 | Japan . |
| 7-58337 | 3/1995 | Japan . |
| 7-249772 | 9/1995 | Japan . |
| 8-97431 | 4/1996 | Japan . |

*Primary Examiner*—Fetsum Abraham
*Attorney, Agent, or Firm*—Sughrue, Mion, Zinn, Macpeak & Seas, PLLC

[57] ABSTRACT

A thin film field effect transistor includes source and drain regions, an active region sandwiched by the source and drain semiconductor regions. A gate insulating film is provided to cover the source and drain regions and the active region, and a semiconductor gate is formed on the gate insulating film above the active region. A gate electrode is formed on the semiconductor gate such that a non-covering portion where the gate electrode does not cover the semiconductor gate is formed.

5 Claims, 17 Drawing Sheets

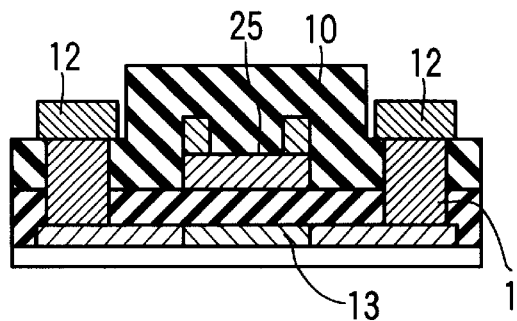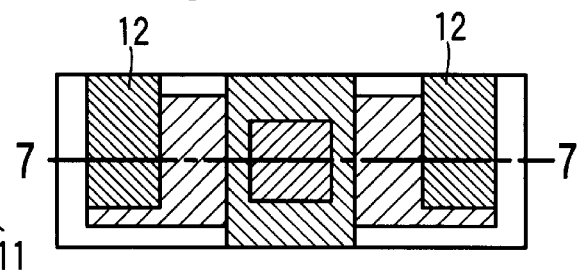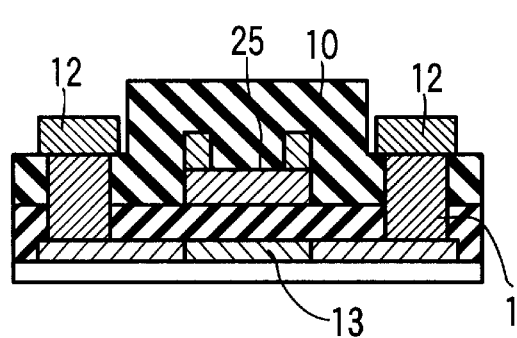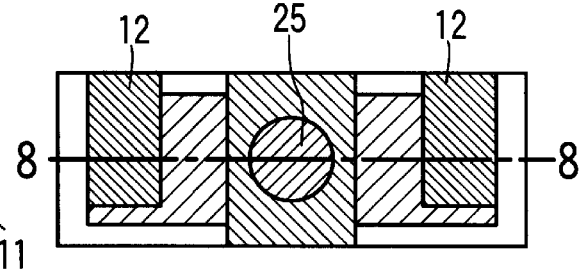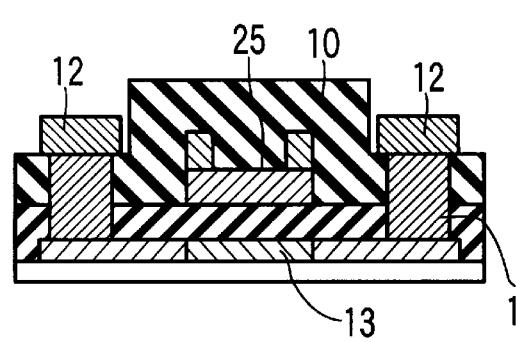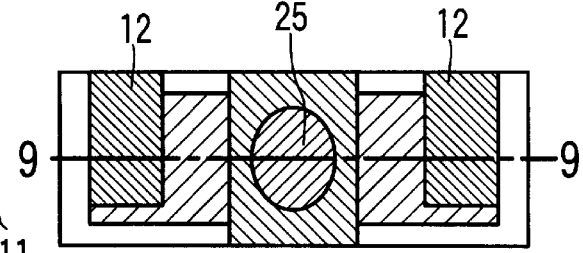

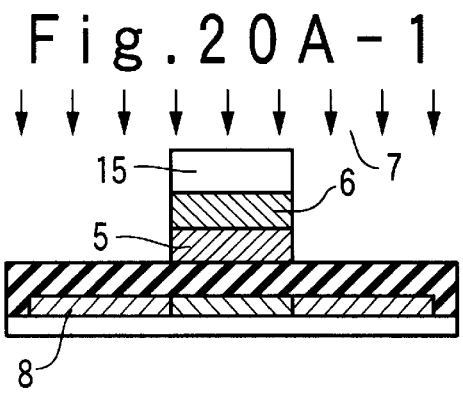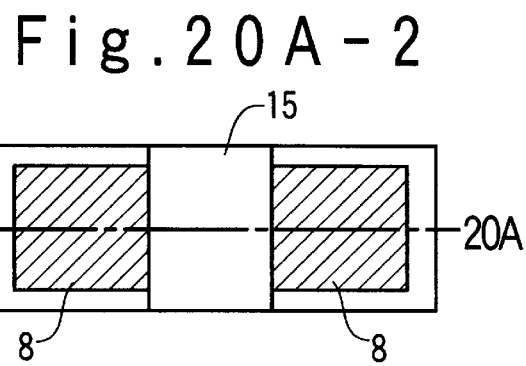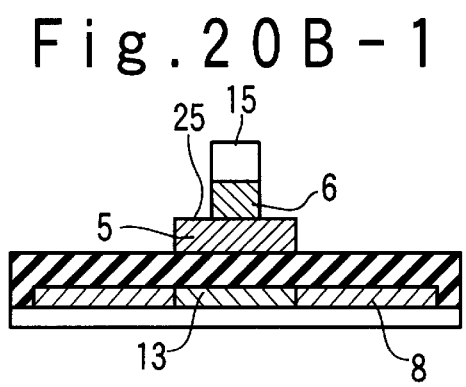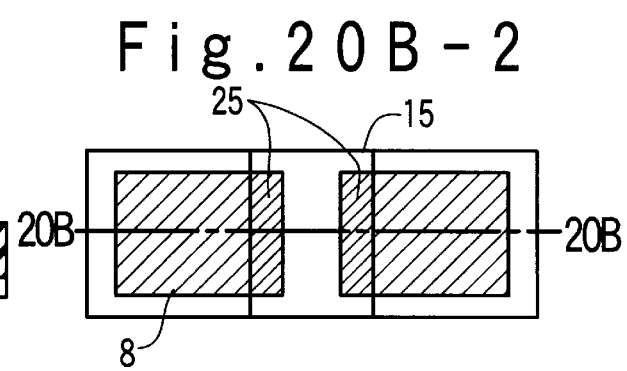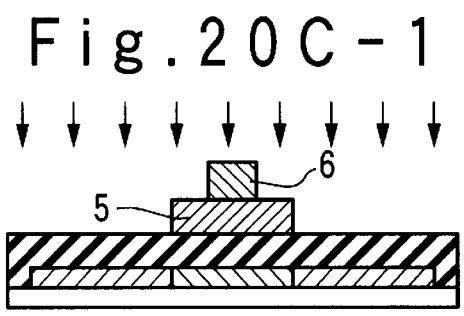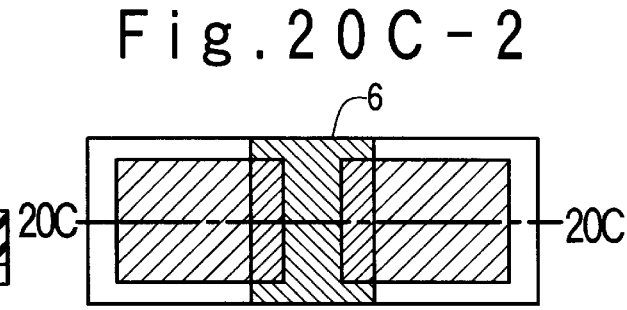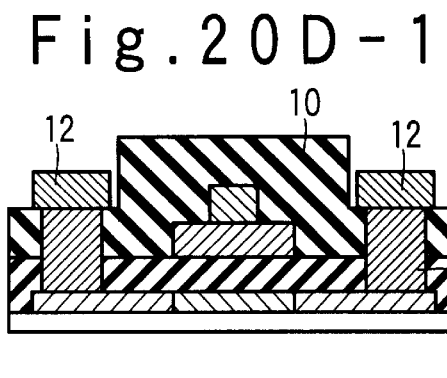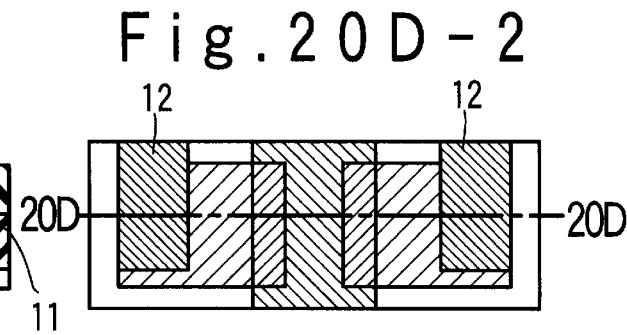

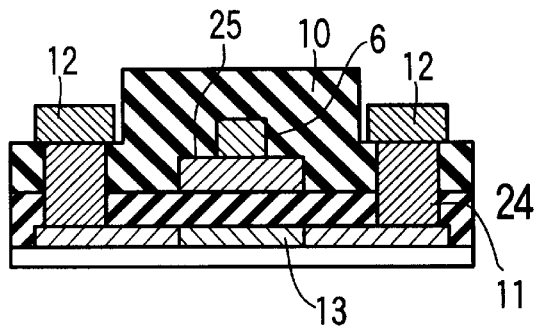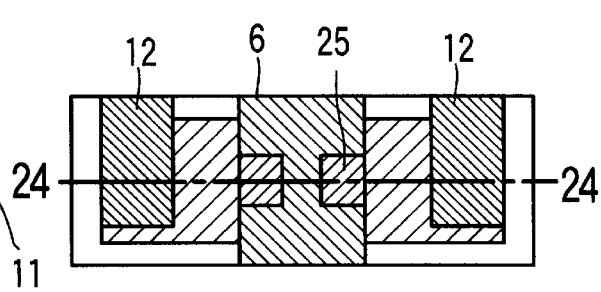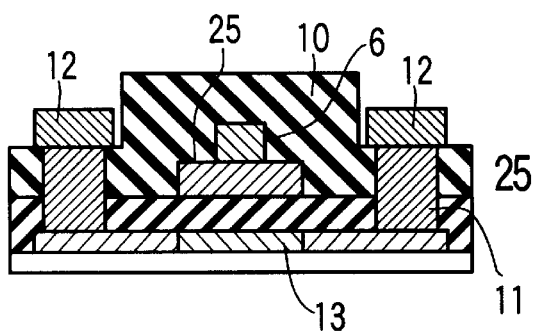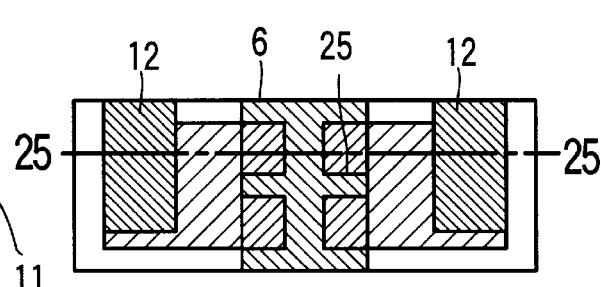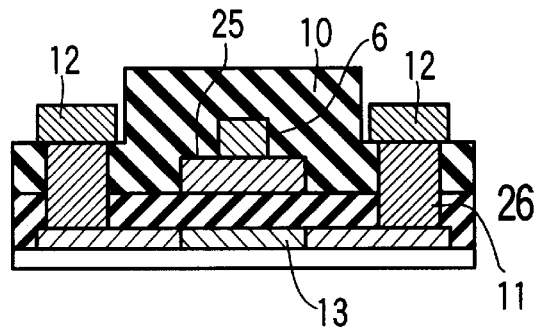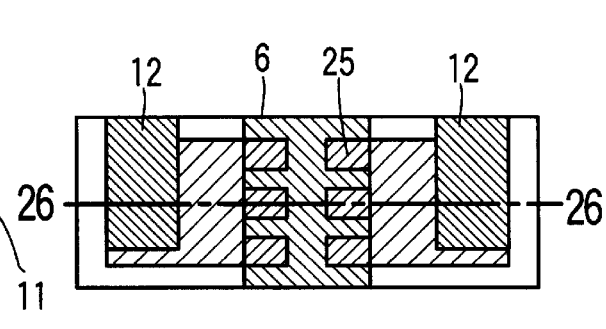

THIN FILM TRANSISTOR WITH REDUCED HYDROGEN PASSIVATION PROCESS TIME

BACKGROUND OF THE INVENTION

1. Field of the Invention

The present invention relates to a thin film transistor and a manufacturing method for the same, and more particularly, to reduction of a hydrogen passivation process time in a top gate type thin film transistor and a manufacturing method for the same.

2. Description of the Related Art

A polysilicon thin film transistor has equal to or more than 100 times of electron mobility of an amorphous silicon thin film transistor, and an N channel and P channel transistors can be formed as the polysilicon thin film transistors. For this reason, the polysilicon thin film transistor which is formed on a glass substrate can be applied to circuit elements such as a switching transistor of a high resolution liquid crystal display, a drive circuit and liquid crystal switching transistor of a driver integrated liquid crystal display, and a drive circuit transistor of various flat panel displays.

FIGS. 1A-1 to 1F-1 are diagrams illustrating cross sectional views of a polysilicon thin film transistor in a first conventional example of a manufacturing method. FIGS. 1A-2 to 1F-2 are diagrams illustrating plan views of the polysilicon thin film transistor in the manufacturing process.

As shown in FIGS. 1A-1 to 1A-2, a polysilicon thin film is formed on a glass substrate 1. Excimer laser light 3 is irradiated to the thin film such that the silicon thin film can absorb the excimer laser light 3 sufficiently. As a result, the amorphous silicon or polysilicon are fused and re-crystallized. In this way, high quality polysilicon film 2 is formed.

Next, as shown by FIGS. 1B-1 and 1B-2, the polysilicon film 2 is patterned in such an island manner. Then, a gate insulating film 4 such as a silicon oxide film is formed on the patterned polysilicon film 2 as a gate insulating film.

Next, as shown by FIGS. 1C-1 and 1C-2, a low resistance polysilicon gate electrode 5 in which impurity ions such as phosphorus ions are added in a high concentration, and a gate metal/alloy electrode 6 are deposited in this order and patterned to form a gate structure. The gate metal/alloy electrode 6 is formed of metals such as aluminum or metal silicide such as tungsten silicide.

Next, as shown by FIGS. 1D-1 and 1D-2, the ion implantation of the impurity ions 7 is performed to form source and drain areas 8, using a resist layer 15, the gate metal/alloy electrode 6 and the low resistance polysilicon gate electrode 5 as a mask. Then, the activation heat treatment is performed such that the impurity ions are arranged on the crystal lattice positions.

Next, as shown by FIG. 1E-1 and 1E-2, the substrate 1 is exposed to a hydrogen plasma atmosphere or a hydrogen atmosphere for 1 to 2 hours at the temperature of 200 to 400° C. As a result, hydrogen atoms, hydrogen radicals or hydrogen ions are diffused into the thin film transistor (device). Thus, the hydrogen passivation process of the polysilicon film (hereinafter, to be also referred to as a hydrogenation process) is performed.

Last, as shown in FIGS. 1F-1 and 1F-2, an interlayer insulating film 10 is formed, contact halls 11 are opened and source and drain wiring electrodes 12 are formed.

In this way, the polysilicon thin film transistor is complete.

Recent years, the polysilicon film forming technique using the excimer laser annealing is established as described with reference to FIGS. 1A-1 to 1F-2. At that time, the process maximum temperature of the transistor is about 500 to 600° C. Therefore, non-expensive alkaline glass substrate can be used.

Also, various film forming techniques, etching techniques, photolithography techniques, impurity introduction techniques, the excimer laser annealing technique are developed in correspondence to use of a large size substrate. Because the thin film transistors can be formed on the non-expensive large glass substrate, the manufacturing cost falls. Thus, it is made possible to reduce the price of an application product so that the polysilicon thin film transistor application product market is created and extended.

In order to accelerate the market extension of the application products of the polysilicon thin film transistor, cost reduction is mainly important. For this purpose, the following matters are technically important in the thin film transistor manufacturing method:

(1) use of a large size glass;

(2) manufacturing process at a lower temperature; and (3) increase of throughput.

When attention is paid to the above problem (3) of them, a hydrogenation process is a cause for the reduction of the throughput among all the polysilicon thin film transistor manufacturing processes. The hydrogenation process is performed to hydrogen-terminate silicon dangling bonds existing in crystal grain boundary of the polysilicon acting as an active layer and an interface between the polysilicon film and the gate insulating film.

The hydrogenation process is generally performed in the last stage of the thin film transistor manufacturing method. The hydrogenation process time is about 1 to 2 hours and very long. This is because a normal transistor structure is the top gate type as shown in FIG. 2 or FIG. 3. In this type thin film transistor, hydrogen molecules, hydrogen ions or hydrogen radicals can hardly pass the gate wiring electrode 6, which is formed of metal and metal silicide. Therefore, most of the hydrogen molecules, hydrogen ions or hydrogen radicals move along the long distance diffusion course 14 and reach the polysilicon active region 13 to which the passivation should be performed as shown in second and third conventional examples of FIG. 2 and FIG. 3. In the third conventional example shown in FIG. 3, because a contact hall is smaller than a gate metal/alloy electrode 6 in area, the hydrogen molecules, hydrogen ions or hydrogen radicals diffuses from the top of active region 13, too. Therefore, the hydrogenation process efficiency is improved, compared with the second conventional example shown in FIG. 2.

However, the hydrogen molecules, hydrogen ions or hydrogen radicals must diffuse for the film thickness of an interlayer insulating film 10 and the distance for the contact hall. Thus, the substantial increase of the hydrogenation process efficiency can not be expected. FIG. 4 shows hydrogen concentration in the active region in a source and drain direction when the hydrogen molecules, hydrogen ions or hydrogen radicals are diffused through the diffusion routes shown in FIG. 2 or FIG. 3. As seen from FIG. 4, the hydrogenation process efficiency is very low in the active region central portion which is apart from the end of the gate electrode by 2 to 3 $\mu$m. This causes the long hydrogenation process time.

In one of the methods of solving this problem, the hydrogenation process is performed before the gate wiring electrode is formed, so that the hydrogen molecules, hydrogen ions or hydrogen radicals can be diffused through the gate insulating film. In the usual thin film transistor method, impurity ion implantation into the source and drain regions is performed using the gate wiring electrode of metal or metal silicide as a mask, and then heat-treatment is performed at the temperature equal to or higher than 500° C. for the impurity ion activation. For this reason, the hydrogen atoms bonded to silicon atoms are almost thermally dissociated during the heat treatment. Therefore, when the above method is applied, it is necessary that impurity ion activation equal to or lower than 350° C. is established. In the present situation, this is difficult.

Therefore, the hydrogenation process Is strongly needed which is performed sufficiently in a short time after the impurity ion implantation using the gate electrode as the mask and the activation a re performed. Such a hydrogenation process is described in Japanese Laid Open Patent Application (JP-A-Heisei 7-38118).

In t his fourth conventional example, two gate electrode s a re formed on a single polysilicon active region such that the two gate electrodes are in parallel to each other and connected to each other at one end. Then, impurity ion implantation is performed. In this method, two channel regions with a short channel length are formed and the hydrogenation process is performed to the transistor with the two channel regions. Thus, the hydrogenation process is efficiently performed. FIG. 5 shows the structure of the thin film transistor. However, there are various problems in this thin film transistor manufacturing method.

First, there is an opening on the gate insulating film, and only an interlayer insulating film, and a protection film exist on the opening. For this reason, the quantity of moisture diffusing from the atmosphere into the gate insulating film becomes very much, compared with the case where the gate insulating film is covered by the gate electrode. As a result, the problem occurs in the device operational reliability.

Second, the polysilicon activation region to which the hydrogenation process should be performed is covered by the gate electrode. Therefore, it is impossible to substantially increase the hydrogenation process efficiency, unless each channel length is made very short.

Third, a low resistance polysilicon region exists between two channels between the source and the drain. This resistance components decreases the ON current of the transistor.

Therefore, the technique described in the Japanese Laid Open Patent Application (JP-AHeisei 7-38118) is not practical from the above reasons.

In addition, a thin film transistor manufacturing method is described in Japanese Laid Open Patent Application (JP-A-Showa 63-119270). In this reference, a thin film transistor is formed to have a gate electrode of polysilicon and then an interlayer insulating film and a protection film are formed. Subsequently, hydrogen ions are irradiated. However, in this method, hydrogen diffusion route is long.

Also, a thin film transistor manufacturing method is described in Japanese Laid Open Patent Application (JP-A-Showa 64-53553). In this reference, a substrate on which a thin film transistor has been completed is heated and hydrogen gas pressure is increased. In such a condition, hydrogen atoms are diffused in the thin film transistor. In this method, the hydrogen diffusion route is also long.

Also, a thin film transistor manufacturing method is described in Japanese Laid Open Patent Application (JP-A-Heisei 5-55521). In this reference, an active region is formed a gate electrode through a gate insulating film. Therefore, the reference is different from the present invention in the structure.

Also, a thin film transistor manufacturing method is described in Japanese Laid Open Patent Application (JP-A-Heisei 6-77484). In this reference, a channel layer has a 2-layer structure, a hydrogen supplying source is provided. between two channel layers.

Also, a thin film transistor manufacturing method is described in Japanese Laid Open Patent Application (JP-A-Heisei 6-314697). In this reference, a gate insulating film includes water or hydrogen, and hydrogen ions are supplied to the channel layer by applying a voltage.

Also, a thin film transistor manufacturing method Is described in Japanese Laid Open Patent Application (JP-A-Heisei 7-249772). In this reference, an interlayer insulating film 4, a silicon nitride film 8, and an amorphous silicon film 9 are formed on a thin film transistor in this order. Then, a hydrogen passivation process is performed. Thus, in the reference, the hydrogen diffusion route is long.

Also, a thin film transistor manufacturing method is described in Japanese Laid Open Patent Applications (JP-A-Heisei 7-14849 and JP-A-Heisei 7-58337). In this reference, a hydrogen passivation process and a impurity introduction process are performed to a polysilicon layer 12 before a gate insulating film is formed. However, in this reference, processes after the hydrogen passivation must be performed below 450° C.

Also, a thin film transistor manufacturing method is described in Japanese Laid Open Patent Application (JP-A-Heisei 8-97431). In this reference, a hydrogenation process is performed after a gate electrode is formed. The gate electrode 14 has the same area has that of the active region 12*a*. Therefore, the diffusion route in the reference is the same as that in the second conventional example.

SUMMARY OF THE INVENTION

The present invention is accomplished to solve the above problems. Therefore, an object of the present invention is to provide a to gate type thin film transistor in which a hydrogenation process can be performed for a short time.

Another object of the present invention is to provide a method of manufacturing the same.

In order to achieve an aspect of the present invention, a thin film field effect transistor includes source and drain regions, an active region sandwiched by the source and drain semiconductor regions. A gate insulating film is provided to cover the source and drain regions and the active region, and a semiconductor gate is formed on the gate insulating film above the active region. A gate electrode is formed on the semiconductor gate electrode such that a non-covering portion where the gate electrode does not cover the semiconductor gate is formed.

In this case, at least one opening portion may be formed in the gate electrode such that the non-covering portion is formed, or the non-covering portion may be formed on an edge portion. Also, the semiconductor gate may be formed of at least one an amorphous silicon film, a polysilicon film and a microcrystalline silicon film, and the semiconductor gate may have a film thickness of about 1 μm or below. Further, the gate electrode is formed of a metal film or a metal alloy film.

The thin film field effect transistor may further include another gate electrode connected to the semiconductor gate and the gate electrode.

In order to achieve another aspect of the present invention, a method of manufacturing a thin film field effect transistor, includes the steps of:

forming source and drain regions and an active region sandwiched by the source and drain regions on a substrate;

forming a gate insulating film on the source and drain regions and the active region;

forming a gate structure which includes a semiconductor gate and a gate electrode, wherein the semiconductor gate is formed on the gate insulating film above the active region, and the gate electrode is formed on the semiconductor gate such that the semiconductor gate has an exposure portion where the semiconductor gate is not covered by the gate electrode; and performing a hydrogen passivation after the gate structure is formed.

The gate electrode may be formed of one of metal and metal alloy, and the semiconductor gate may be formed of at least one of polysilicon, amorphous silicon and microcrystalline silicon.

The step of forming a gate structure may include:

depositing a semiconductor film on the gate insulating film;

depositing a film for the gate electrode on the semiconductor film;

patterning the semiconductor film and the film for the gate electrode at a time to form the semiconductor gate; and patterning the patterned film for the gate electrode to form the gate electrode with the exposure portion.

Instead, the step of forming a gate structure may include:

depositing a semiconductor film on the gate insulating film;

patterning the semiconductor film to form the semiconductor gate;

depositing a film for the gate electrode on the semiconductor gate and the gate insulating film;

patterning the film for the gate electrode to form the gate electrode with the exposure portion on the semiconductor gate.

The hydrogen passivation steps may include injecting at least one of hydrogen molecules, hydrogen ions and hydrogen radicals in a state in which the substrate is heated to a temperature in a range of 200 to 400° C. for a time shorter than 40 minutes, using the exposure portion of the gate electrode, to perform the hydrogen passivation.

The method may further includes the step of forming another gate electrode on the gate electrode and the semiconductor gate.

In order to achieve still another aspect of the present invention, a method of manufacturing a thin film field effect transistor, includes the steps of:

forming source and drain regions and an active region sandwiched by the source and drain regions on a substrate;

forming a gate insulating film on the source and drain regions and the active region;

forming a gate structure which includes a semiconductor gate and a gate electrode, wherein the semiconductor gate is formed on the gate insulating film above the active region, and the gate electrode is formed on the semiconductor gate such that the semiconductor gate has an exposure portion where the semiconductor gate is not covered by the gate electrode; and injecting at least one of hydrogen molecules, hydrogen ions and hydrogen radicals through the exposure portion of the semiconductor gate.

BRIEF DESCRIPTION OF THE DRAWINGS

FIGS. 1A-2 to 1F-2 are schematic plan views of the polysilicon thin film transistor in the first conventional example of the manufacturing method;

FIG. 2 is a diagram illustrating a hydrogen diffusion state in a hydrogenation process of a second conventional example of the manufacturing method;

FIGS. 6A-1 to 6D-1 are cross sectional views of a polysilicon thin film transistor in a manufacturing method according to a first embodiment of the present invention, and FIGS. 6A-2 to 6D-2 are schematic plan views of the polysilicon thin film transistor in the manufacturing method according to the first embodiment of the present invention;

FIGS. 7-1 and 7-2 are a cross section view in the direction of channel and schematic plan view of a first modification of the polysilicon thin film transistor according to the first embodiment of the present invention;

FIGS. 8-1 and 8-2 are a cross section view invention in the direction of channel and schematic plan view of a second modification of the polysilicon thin film transistor according to the first embodiment of the present;

FIGS. 9-1 and 9-2 are a cross section view invention in the direction of channel and schematic plan view of a third modification of the polysilicon thin film transistor according to the first embodiment of the present;

FIGS. 14A-1 to 14D-1 are cross sectional views of the polysilicon thin film transistor in the manufacturing method according to a second embodiment of the present invention, and FIGS. 14A-2 to 14D-2 are schematic plan views of the polysilicon thin film transistor in the manufacturing method according to the second embodiment of the present invention;

FIGS. 17-1 and 17-2 are a cross section view in the direction of channel and schematic plan view of a first modification of the polysilicon thin film transistor according to the second embodiment of the present invention;

FIGS. 18-1 and 18-2 are a cross section view in the direction of channel and schematic plan view of a second modification of the polysilicon thin film transistor according to the second embodiment of the present invention;

FIGS. 19-1 and 19-2 are a cross section view invention in the direction of channel and schematic plan view of a third modification of the polysilicon thin film transistor according to the second embodiment of the present;

FIGS. 20A-1 to 20D-1 are cross sectional views of the polysilicon thin film transistor in the manufacturing method according to a third embodiment of the present invention, and FIGS. 20A-2 to 20D-2 are schematic plan views of the polysilicon thin film transistor in the manufacturing method according to the third embodiment of the present invention;

FIGS. 23-1 and 23-2 are a cross section view and schematic plan view of a first modification of the polysilicon thin film transistor according to the third embodiment of the present invention in the direction of channel;

FIGS. 24-1 and 24-2 are a cross section view in the direction of channel and schematic plan view of a second modification of the polysilicon thin film transistor according to the third embodiment of the present invention;

FIGS. 25-1 and 25-2 are a cross section view in the direction of channel and schematic plan view of a third modification of the polysilicon thin film transistor according to the third embodiment of the present invention;

FIGS. 26-1 and 26-2 are a cross section view in the direction of channel and schematic plan view of a fourth modification of the polysilicon thin film transistor according to the third embodiment of the present invention;

FIGS. 27A-1 to 27D-1 are cross sectional views of the polysilicon thin film transistor in the manufacturing method according to a fourth embodiment of the present invention, and FIGS. 27A-2 to 27D-2 are schematic plan views of the polysilicon thin film transistor in the manufacturing method according to the fourth embodiment of the present invention;

FIGS. 30-1 and 30-2 are a cross section view in the direction of channel and schematic plan view of a first modification of the polysilicon thin film transistor according to the fourth embodiment of the present invention;

FIGS. 31-1 and 31-2 are a cross section view and schematic plan view of a second modification of the polysilicon thin film transistor according to the fourth embodiment of the present invention in the direction of channel;

FIGS. 32-1 and 32-2 are a cross section view in the direction of channel and schematic plan view of a third modification of the polysilicon thin film transistor according to the fourth embodiment of the present invention;

FIGS. 33-1 and 33-2 are a cross section view in the direction of channel and schematic plan view of a fourth modification of the polysilicon thin film transistor according to the fourth Embodiment of the present invention; and FIGS. 34-1 and 34-2 are a cross section view in the direction of channel and schematic plan view of a fifth modification of the polysilicon thin film transistor according to the fourth Embodiment of the present invention.

DESCRIPTION OF THE PREFERRED EMBODIMENTS

A polysilicon thin film transistor of the present invention and a manufacturing method thereof will be described below in detail with reference to the attached drawings.

First, the polysilicon thin film transistor according to the first embodiment of the present invention will be described with reference to FIGS. 6A-1 to 6D-2.

Figures 1, 1A:
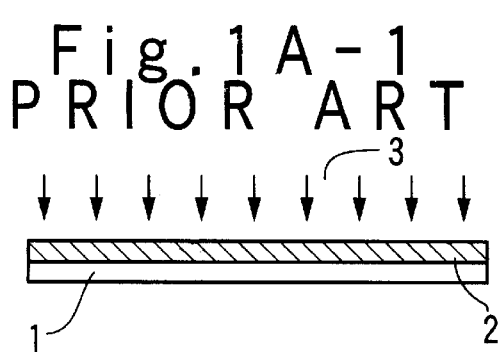
FIGS. 1A-1 to 1F-1 are cross sectional views of a polysilicon thin film transistor in a first conventional example of a manufacturing method.
Figures 1, 1A, 2:
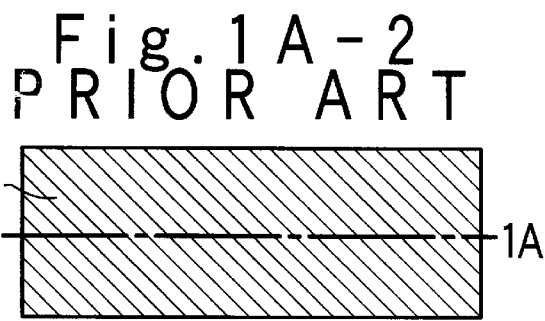
Figures 1, 1B:
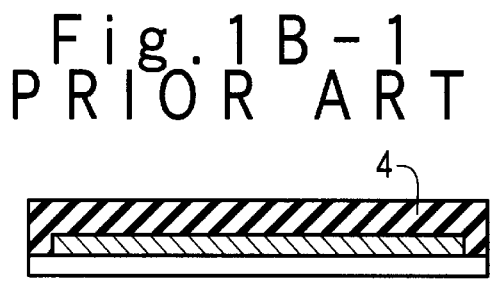
Figures 1, 1B, 2:
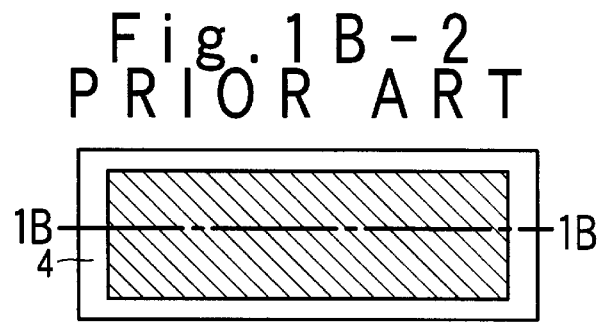
Figures 1, 1C:
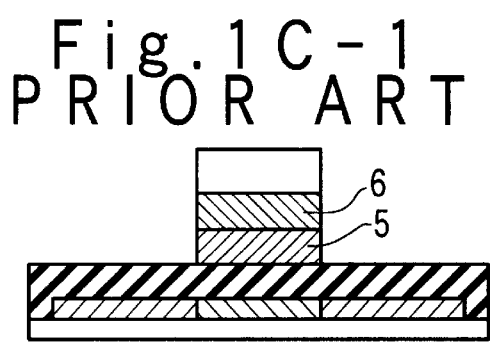
Figures 1, 1C, 2:
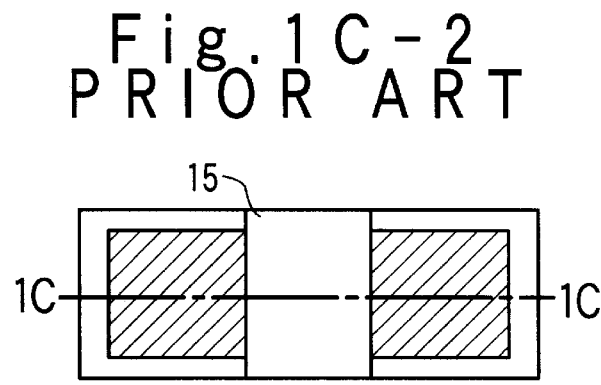
Figures 1, 1D:
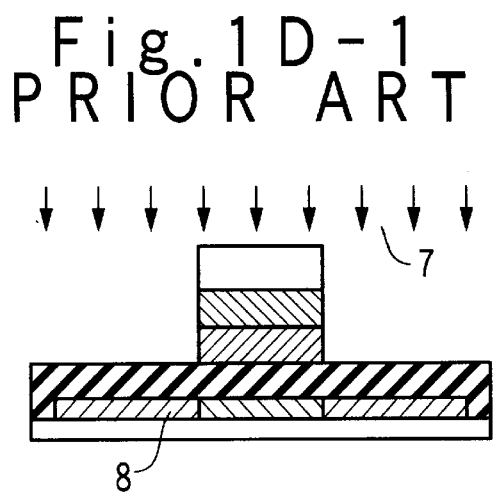
Figures 1, 1D, 2:
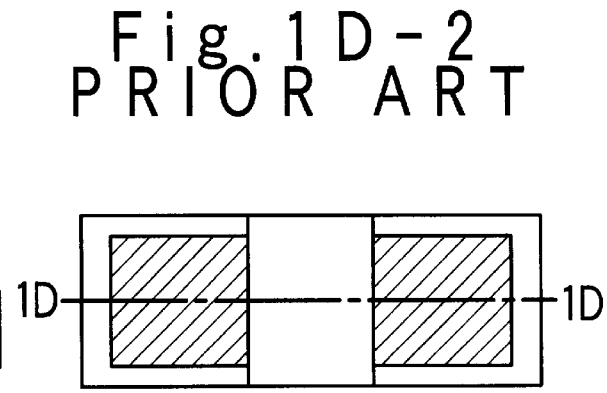
Figures 1, 1E:
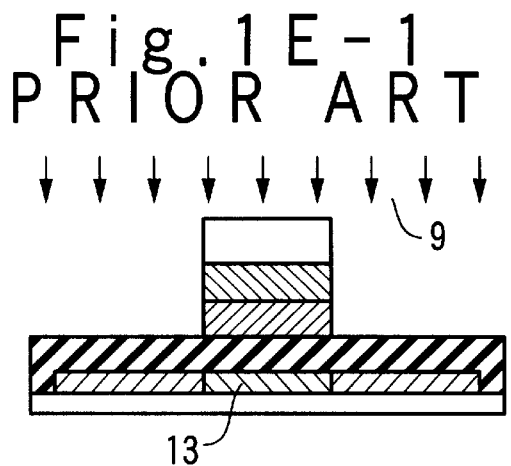
Figures 1, 1E, 2:
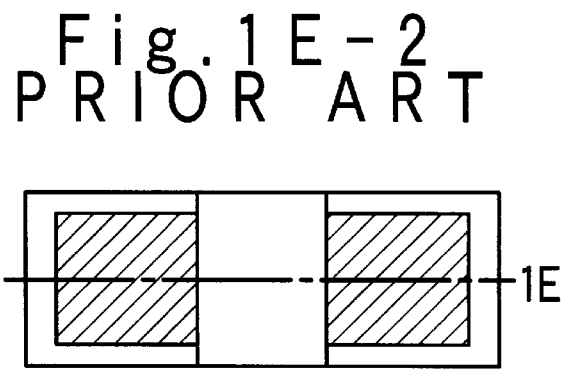
Figures 1, 1F:
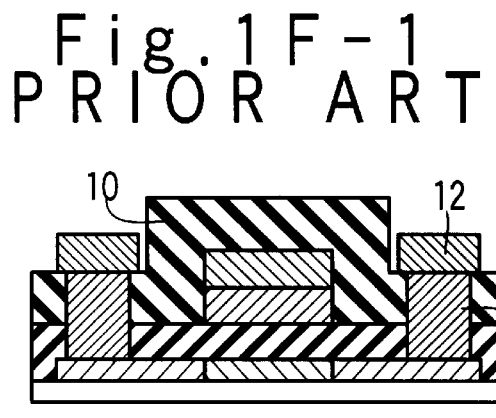
Figures 1, 1F, 2:
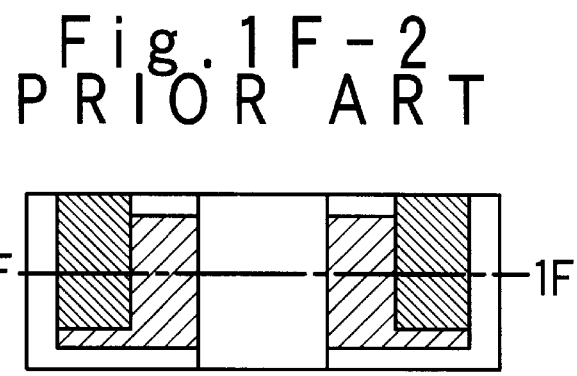
Figure 2:
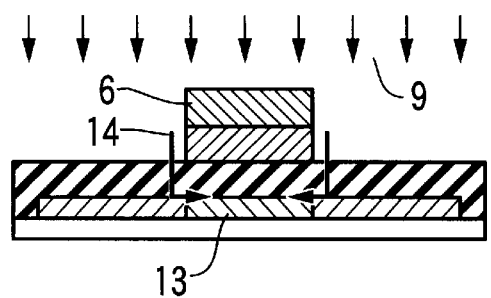
Figures 1, 6A:
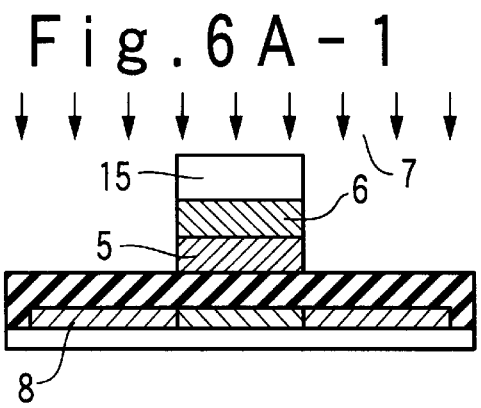
Figures 2, 6A:
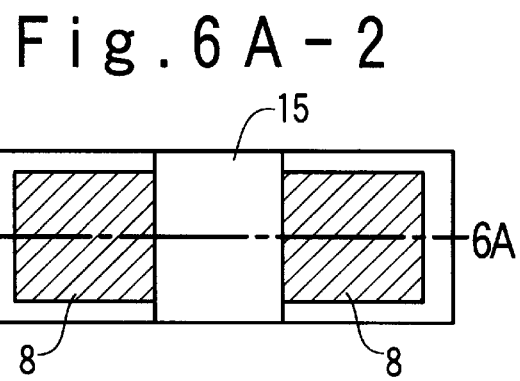
Figures 1, 6B:
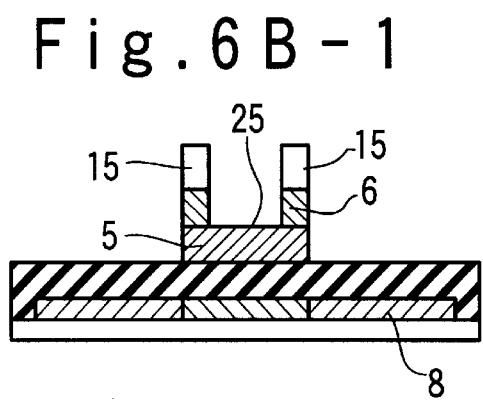
Figures 2, 6B:
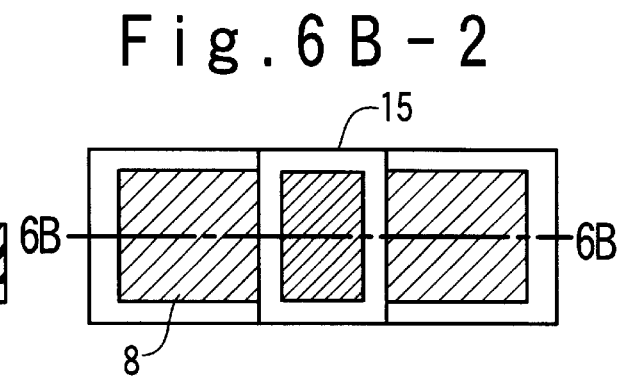
Figures 1, 6C:
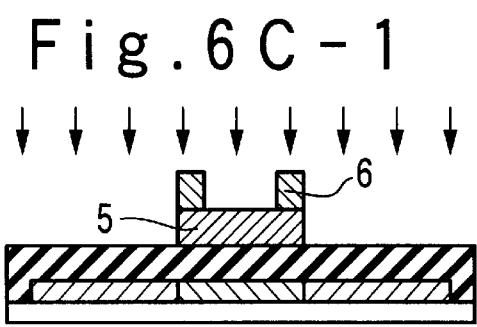
Figures 2, 6C:
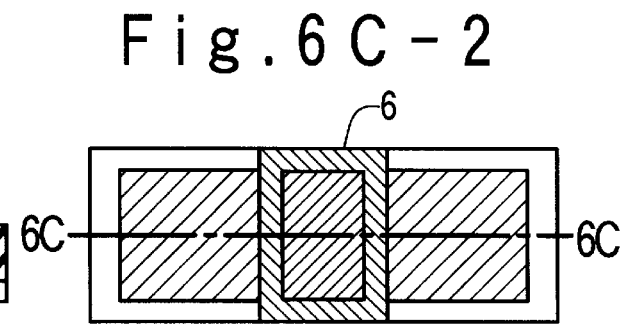
Figures 1, 6D:
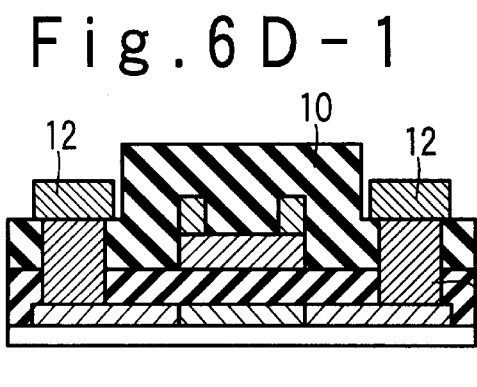
Figures 2, 6D:
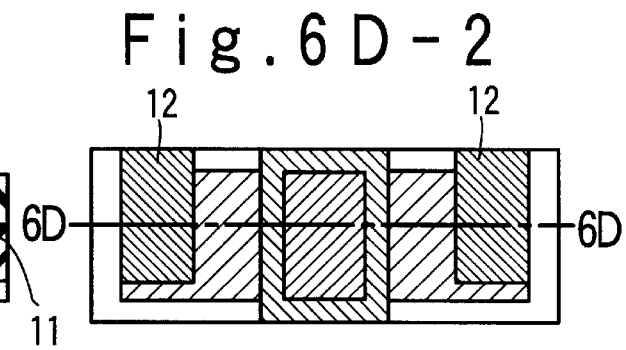

FIGS. 6A-1 to 6D-1 show the cross section views of the polysilicon thin film transistor manufactured by the method according to the first embodiment of the present invention in the channel. Also, FIGS. 6A-2 to 6D-2 show the plan views of the polysilicon thin film transistor manufactured by the method according to the first embodiment of the present. In the first embodiment, the processes until the impurity ion implantation process using the gate metal/alloy electrode as a mask are the same as those in the conventional example shown in FIGS. 1A-1 to 1D-2. Therefore, the process from the impurity ion implantation process to a device completion process are shown in FIGS. 6A-1 to 6D-2.

As shown in FIGS. 6A-1 and 6A-2, impurity ion introduction is performed by an ion implantation method or an ion doping method using a patterned resist layer 15, a gate metal/alloy electrode 6 and a low resistance polysilicon gate electrode 5 as a mask to form source and drain regions 8. Phosphorus ions or arsenic ions are introduced in the area where an N channel transistor is formed as the impurity ions, and boron ions are introduced in the area where a P channel transistor is formed.

Next, as shown in FIGS. 6B-1 and 6B-2, the resist layer mask 15 is re-patterned. Then, the gate metal/alloy electrode 6 is patterned such that an opening is formed above a polysilicon active region 13 via the gate insulating film 4. That is, a part of the gate metal/alloy electrode 6 is etched such that a portion of a low resistance polysilicon gate electrode 5 is exposed. In this way, a low resistance polysilicon electrode exposure section 25 is formed.

In this case, the shape of the low resistance polysilicon electrode exposure section 25 is not limited to the rectangle shown in FIGS. 6B-1 to 6B-2. A square shape as shown in FIGS. 7-1 and 7-2, a circle shape as shown in FIGS. 8-1 and 8-2, and an ellipse shape as shown in FIGS. 9-1 and 9-2 may be used.

Figure 12:
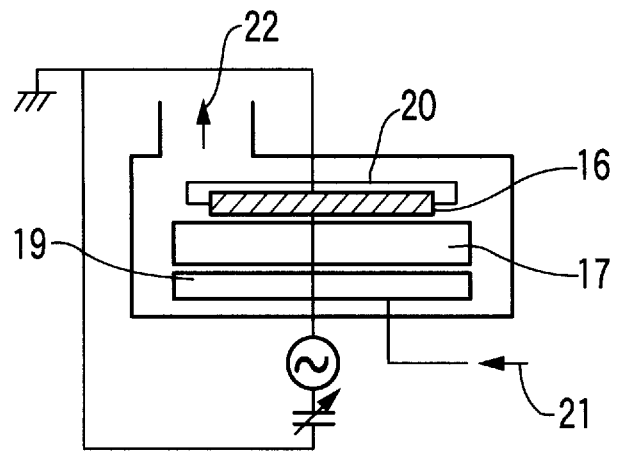
FIG. 12 is a block diagram showing the state of the hydrogenation process using a parallel plate plasma apparatus.
Figure 13:
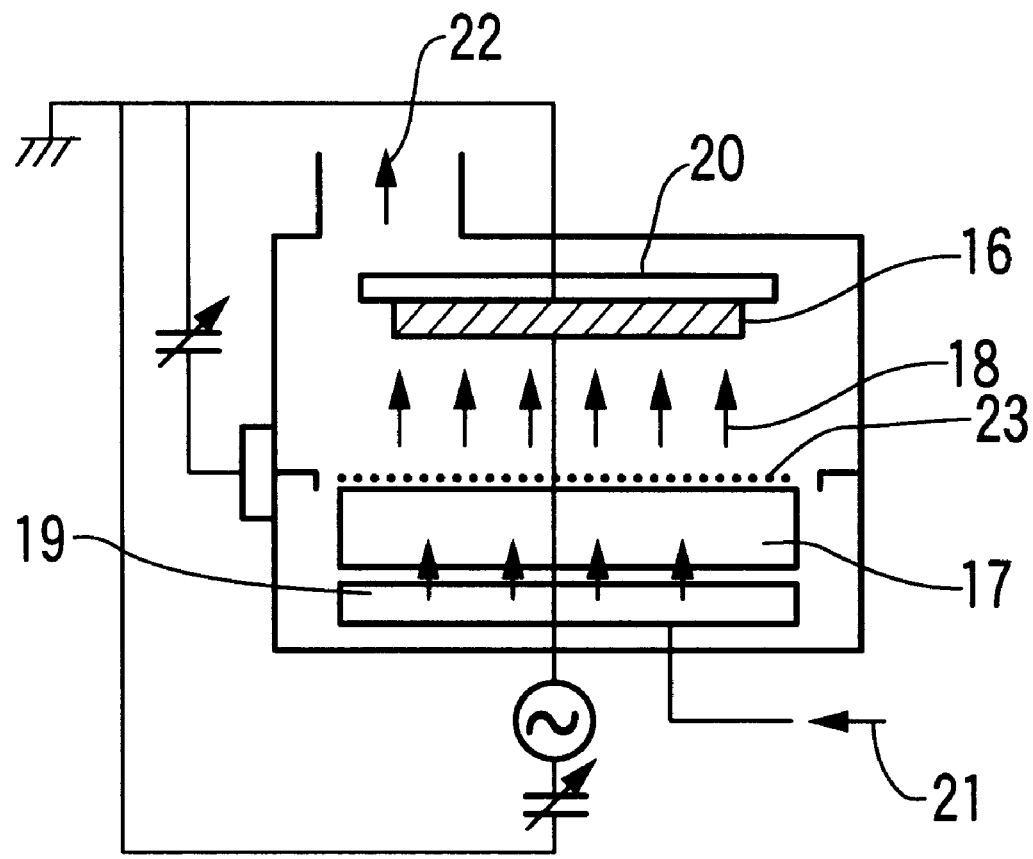
FIG. 13 is a block diagram showing the state of the hydrogenation process using a parallel plate remote plasma apparatus.

Next, as shown in FIGS. 6C-1 and 6C-2, a hydrogenation process is performed. The hydrogenation process is performed by exposing a device as a thin film transistor formed on a substrate to a hydrogen atmosphere or a hydrogen plasma atmosphere or a hydrogen radical atmosphere at the device temperature of about 200 to 400° C. There are various method of exposing a device 16 in which the gate metal/alloy electrode 6 has been formed, to the hydrogen plasma. In the method shown in FIG. 12m, the apparatus has a same structure as a parallel plate plasma CVD apparatus. The device 16 is generally exposed to a hydrogen plasma 17 using an anode combination system in which the device 16 is installed in the counter electrode 20 of a high frequency application electrode 19. In another method shown in FIG. 13, hydrogen plasma 17 is generated between a high frequency application electrode 19 and a middle mesh plate electrode 23, using the parallel plate remote plasma CVD apparatus. Generated hydrogen radicals 18 diffuse out of the plasma region and reaches the device 16 to contribute to the hydrogenation process. As a remote plasma method, because a plasma generation region is merely separated from the device 16 spatially, the ECR plasma CVD apparatus and the microwave plasma CVD apparatus can be used.

Figure 10:
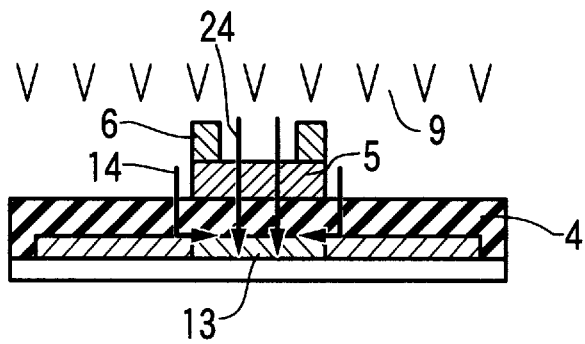
FIG. 10 is a schematic diagram showing a hydrogen diffusion state during the hydrogenation process in the polysilicon thin film transistor according to the first embodiment of the present invention.

The diffusion route of hydrogen molecules, hydrogen ions or hydrogen radicals in the hydrogenation process of the present invention is composed of two main routes, as shown in FIG. 10. One is a diffusion route 14 in which the hydrogen molecules, hydrogen ions or hydrogen radicals pass through the gate insulating film 4 from outside the low resistance polysilicon gate electrode. The other is a diffusion route 24 in which the hydrogen molecules, hydrogen ions or hydrogen radicals pass through the low resistance polysilicon gate electrode exposure section 25 and the gate insulating film 4 to the active region 13.

Figure 11:
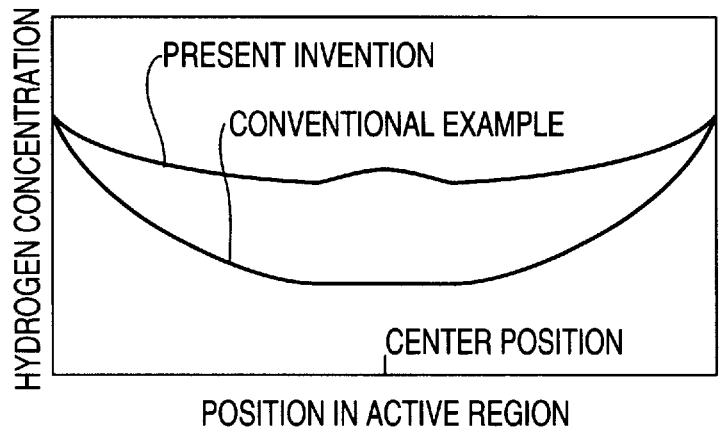
FIG. 11 is a graph showing the concentration distributions of hydrogen molecules, hydrogen ions or hydrogen radicals diffused in the polysilicon active region during the hydrogenation process in the first embodiment of the present invention.

The diffusion route 14 is the same as the diffusion route in the conventional example shown in FIG. 2. In this route, because the hydrogen molecules, hydrogen ions or hydrogen radicals diffuse without passing through the low resistance polysilicon gate electrode 5, there is not hydrogen loss in the low resistance polysilicon gate electrode 5. However, the distance from the end of the low resistance polysilicon gate electrode 5 to the central portion of the polysilicon active region 13 is about 2 to 3 $\mu$m or more and is long. Therefore, like the conventional example shown in FIG. 11, the hydrogen concentration becomes low in the central portion of the polysilicon active region 13. As a result, the diffusion route is insufficient for the hydrogenation process.

On the other hand, in the hydrogenation process of the present invention, there is the diffusion route 24 from above the active region. The hydrogen radicals, the hydrogen ions or hydrogen molecules diffuse through the 2-layer film, i.e., the low resistance polysilicon gate electrode 5 with the film thickness of about 0.1 $\mu$m and the gate insulating film 4, from above the active region. Therefore, a problem of the lack of the hydrogen ions, radicals or molecules in the central portion of the active region in the conventional example can be eliminated. As a result, the hydrogenation process time is possible to be made short, compared with the conventional hydrogenation process. It should be noted that the low resistance polysilicon gate electrode 5 has the film thickness of about 0.1 $\mu$m in the embodiment. However, the low resistance polysilicon gate electrode 5 may have the film thickness of 1 $\mu$m or below. This is applied to the following embodiments.

Examples in the actual polysilicon thin film transistor will be shown below. In an N channel polysilicon thin film transistor with the channel length of 6 $\mu$m and the channel width of 6 $\mu$m, the ON current before a hydrogenation process was $1 \times 10^5$ A in the drain voltage of 12 V and the gate voltage of 12 V. When the hydrogenation process is performed to the device for 2 hours in the parallel plate plasma processor, the ON current was changed to $5 \times 10^4$ A under the same measurement condition.

When another sample was prepared in which a low resistance polysilicon gate electrode exposure section of 4 $\mu$m□ was formed above the central portion of the polysilicon active region in the thin film transistor and a hydrogenation process was performed, the ON current of $5 \times 10^4$ A was measured in the same measurement condition for the hydrogenation process of 20 minutes. Thus, the hydrogenation process time is desirable to be 2 hours or below, and more desirable to be 40 minutes. This is applied to the following embodiments.

Last, as shown in FIGS. 6D-1 and 6D-2, an interlayer insulating film 10 is formed, contact halls 11 are opened, source and drain wiring electrodes 12 are formed. In this way, the device or the polysilicon thin film transistor is completed.

Next, the manufacturing method of the polysilicon thin film transistor according to the second embodiment of the present invention will be described below with reference to FIGS. 14A-1 to 14D-2.

Figures 1, 14A:
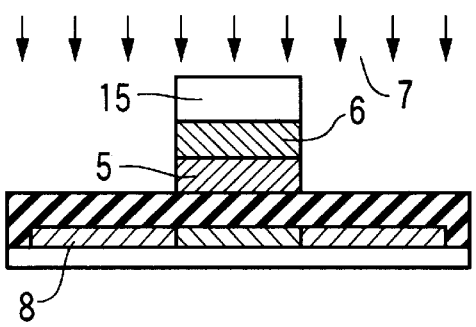
Figures 2, 14A:
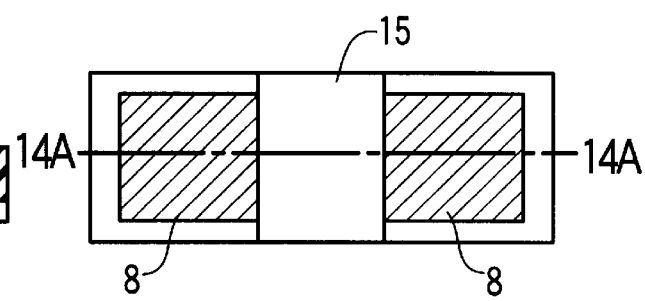
Figures 1, 14B:
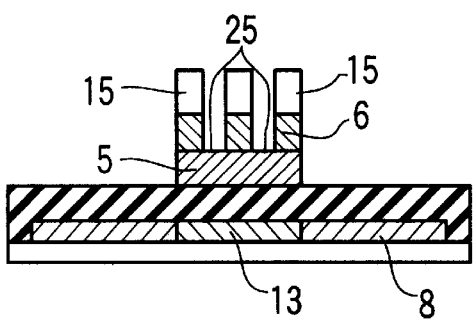
Figures 2, 14B:
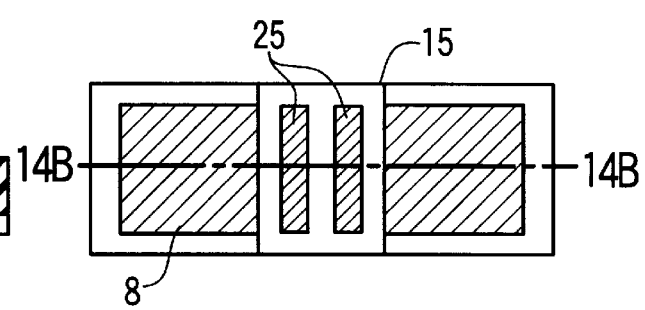
Figures 1, 14C:
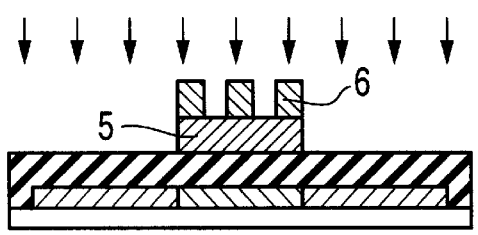
Figures 2, 14C:
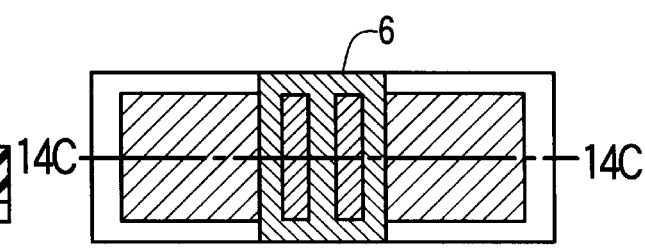
Figures 1, 14D:
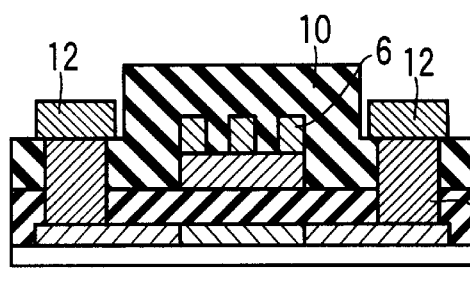
Figures 2, 14D:
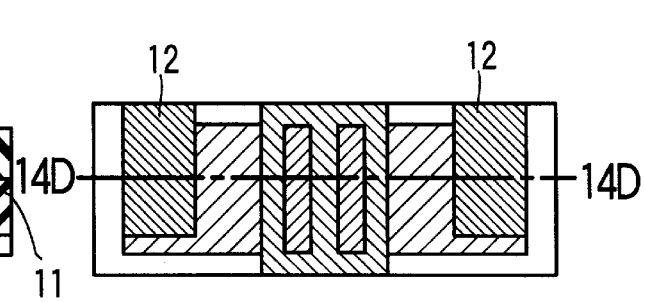

FIGS. 14A-1 to 14D-1 show the cross section views of the polysilicon thin film transistor manufactured by the method according to the second embodiment of the present invention in the channel. Also, FIGS. 14A-2 to 14D-2 show the schematic plan views of the polysilicon thin film transistor manufactured by the method according to the second embodiment of the present. In the second embodiment, the processes until the impurity ion implantation process using the gate metal/alloy electrode as a mask are the same as those in the conventional example shown in FIGS. 1A-1 to 1D-2. Therefore, the process from the impurity ion implantation process to a device completion process are shown in FIGS. 14A-1 to 14D-2.

As shown in FIGS. 14A-1 and 14A-2, impurity ion introduction is performed by an ion implantation method or an ion doping method, using a patterned resist layer 15, a gate metal/alloy electrode 6 and a low resistance polysilicon gate electrode 5 as a mask to form source and drain regions 8. Phosphorus ions or arsenic ions are introduced in the area where an N channel transistor is formed as the impurity ions, and boron ions are introduced in the area where a P channel transistor is formed.

Next, as shown in FIGS. 14B-1 and 14B-2, the resist layer mask 15 is re-patterned. Then, the gate metal/alloy electrode 6 is patterned such that two openings are formed above a polysilicon active region 13 by an etching method to expose a part of the low resistance polysilicon gate electrode 5. In this way, low resistance polysilicon electrode exposure sections 25 are formed.

Next, as shown in FIGS. 14C-1 and 14C-2, a hydrogenation process is performed. The hydrogenation process is performed by exposing a device as a thin film transistor formed on the substrate to a hydrogen atmosphere or a hydrogen plasma atmosphere or a hydrogen radical atmosphere at the device temperature of about 200 to 400° C. As described in the first embodiment, the parallel plate plasma CVD apparatus is used to expose the device to the hydrogen plasma. Also, a remote plasma apparatus such as the parallel plate remote plasma CVD apparatus, the ECR plasma CVD apparatus and a microwave plasma CVD apparatus is used to expose the device to the hydrogen radicals, as described in the first embodiment.

Figure 15:
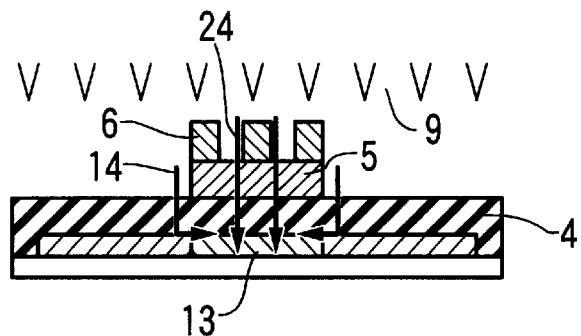
FIG. 15 is a schematic diagram showing a hydrogen diffusion state during the hydrogenation process in the polysilicon thin film transistor according to the second embodiment of the present invention.

The diffusion route of hydrogen molecules, ions or radicals in the hydrogenation process of the present invention is composed of two main routes, as shown in FIG. 15. One is a diffusion route 14 in which the hydrogen molecules, hydrogen ions or hydrogen radicals pass through the gate insulating film 4 from outside the low resistance polysilicon gate electrode. The other is a diffusion route 24 in which the hydrogen molecules, hydrogen ions or hydrogen radicals pass through the low resistance polysilicon gate electrode exposure section 25 and the gate insulating film 4 to the active region 13.

Figure 16:
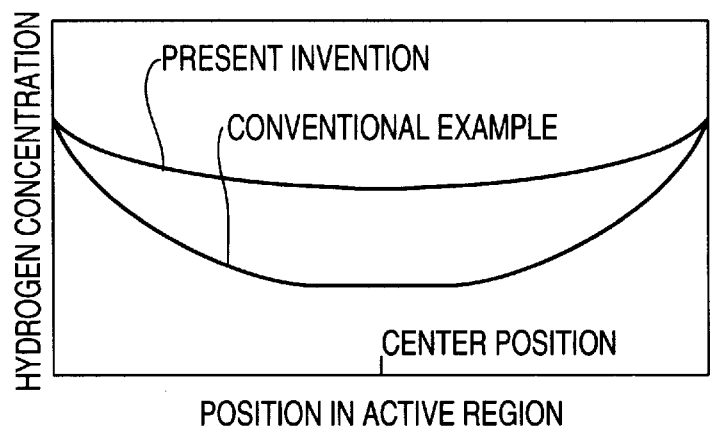
FIG. 16 is a graph showing the concentration distributions of hydrogen molecules, hydrogen ions or hydrogen radicals diffused into the polysilicon active region during the hydrogenation process in the second embodiment of the present invention and the conventional example.

The diffusion route 14 is the same as the diffusion route in the conventional example shown in FIG. 2. In this route, because the hydrogen molecules, hydrogen ions or hydrogen radicals diffuse without passing through the low resistance polysilicon gate electrode 5, there is not hydrogen loss in the low resistance polysilicon gate electrode 5. However, the distance from the end of the low resistance polysilicon gate electrode 5 to the central portion of the polysilicon active region 13 is about 2 to 3 $\mu$m or more and is long. Therefore, like the conventional example shown in FIG. 16, the hydrogen concentration becomes low in the central portion of the polysilicon active region 13. As a result, the diffusion route is insufficient for the hydrogenation process.

On the other hand, in the hydrogenation process of the present invention, there is the diffusion route 24 from above the active region. The hydrogen radicals, the hydrogen ions or hydrogen molecules diffuse through the 2-layer film with the film thickness of about 0.1 $\mu$m, i.e., the low resistance polysilicon gate electrode 5 and the gate insulating film 4, from above the active region. Therefore, a problem of the lack of the hydrogen ions, radicals or molecules in the central portion of the active region in the conventional example can be eliminated. As a result, the hydrogenation process time is possible to be made short, compared with the conventional hydrogenation process.

Last, as shown in FIGS. 14D-1 and 14D-2, an interlayer insulating film 10 is formed, contact halls 11 are opened, source and drain wiring electrodes 12 are formed. In this way, the polysilicon thin film transistor is completed.

Figures 1, 17:
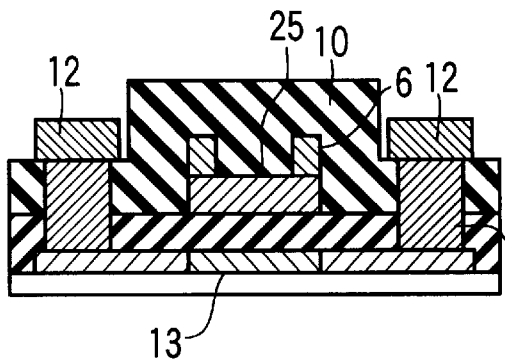
Figures 2, 17:
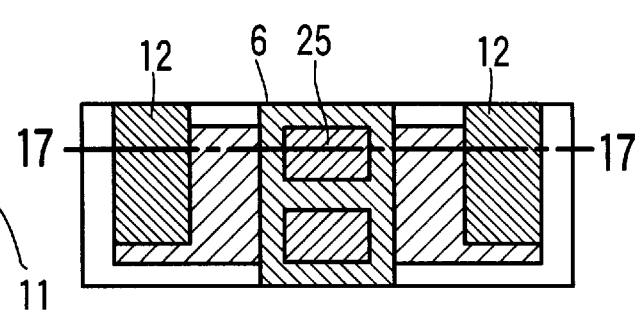
Figures 1, 18:
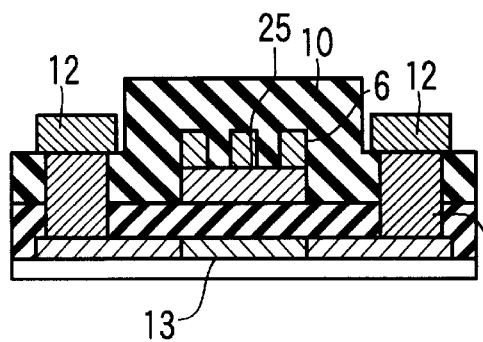
Figures 2, 18:
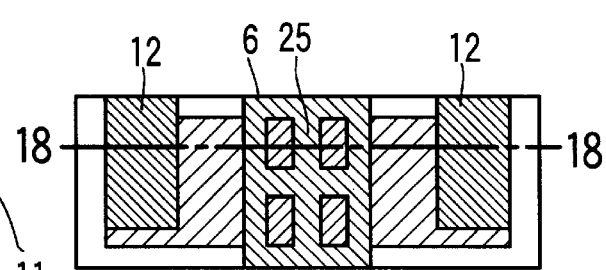
Figures 1, 19:
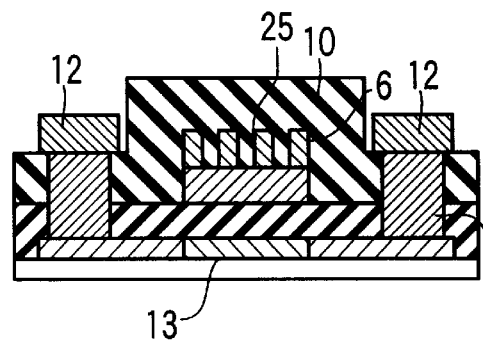
Figures 2, 19:
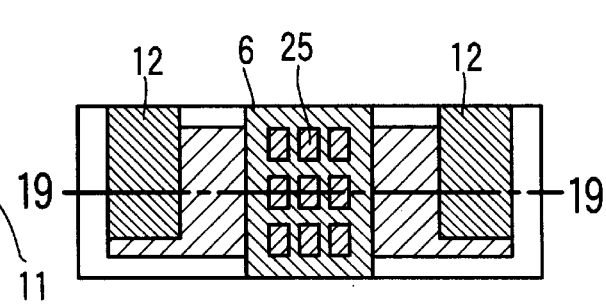

In the second embodiment, the arrangement of low resistance polysilicon electrode exposure sections 25 are not limited to a row in the channel length direction, as shown in FIGS. 14A-1 to 14D-2. The low resistance polysilicon electrode exposure sections 25 may be arranged in the channel width direction as shown in FIGS. 17-1 and 17-2. Also, the number of low resistance polysilicon electrode exposure sections 25 is not limited to two, and may be any number such as 4 as shown in FIGS. 18-1 and 18-2, and 9 as shown in FIGS. 19-1 and 19-2.

Examples in the actual polysilicon thin film transistor will be shown below. In an N channel polysilicon thin film transistor with the channel length of 12 $\mu$m and the channel width of 12 $\mu$m, the ON current before a hydrogenation process was $1 \times 10^5$ A in the drain voltage of 12 V and the gate voltage of 12 V. When the hydrogenation process is performed to the device for 2 hours in the parallel plate plasma processor, the ON current was changed to $1 \times 10^4$ A under the same measurement condition.

When another sample was prepared in which a low resistance polysilicon gate electrode exposure section of 3 $\mu$m in the channel length direction and 8 $\mu$m in the channel width direction was formed above the central portion of the polysilicon active region in the thin film transistor and a hydrogenation process was performed, the ON current of $1 \times 10^4$ A was measured in the same measurement condition for the hydrogenation process of 30 minutes.

Next, the manufacturing method of the polysilicon thin film transistor according to the third embodiment of the present invention will be described below with reference to FIGS. 20A-1 to 20D-2. FIGS. 20A-1 to 20D-1 show the cross section views of the polysilicon thin film transistor manufactured by the method according to the second embodiment of the present invention in the channel. Also, FIGS. 20A-2 to 20D-2 show the schematic plan views of the polysilicon thin film transistor manufactured by the method according to the second embodiment of the present.

In the second embodiment, the processes until the impurity ion implantation process using the gate metal/alloy electrode as a mask are the same as those in the conventional example shown in FIGS. 1A-1 to 1D-2. Therefore, the process from the impurity ion implantation process to a device completion process are shown in FIGS. 20A-1 to 2CD-2.

As shown in FIGS. 20A-1 and 20A-2, impurity ion introduction is performed by an ion implantation method or an ion doping method, using a patterned resist layer 15, a gate metal/alloy electrode 6 and a low resistance polysilicon gate electrode 5 as a mask to form source and drain regions 8. Phosphorus ions or arsenic ions are introduced in the area where an N channel transistor is formed as the impurity ions, and boron ions are introduced in the area where a P channel transistor is formed.

Next, as shown in FIGS. 20B-1 and 20B-2, the resist layer mask 15 is re-patterned. Then, the gate metal/alloy electrode 6 is etched and patterned such that two openings are formed above a polysilicon active region 13 to expose a part of a low resistance polysilicon gate electrode 5. In this way, low resistance polysilicon electrode exposure sections 25 are formed. In this embodiment, a portion of the gate metal/alloy electrode 6 corresponding to at least one edge portion of the active or channel region 13 is removed.

Next, as shown in FIGS. 20C-1 and 20C-2, a hydrogenation process is performed. The hydrogenation process is performed by exposing a device as a thin film transistor formed on the substrate to a hydrogen atmosphere or a hydrogen plasma atmosphere or a hydrogen radical atmosphere at the device temperature of about 200 to 400° C. As described in the first embodiment, the parallel plate plasma CVD apparatus is used to expose the device to the hydrogen plasma. Also, a remote plasma apparatus such as the parallel plate remote plasma CVD apparatus, the ECR plasma CVD apparatus and a microwave plasma CVD apparatus is used to expose the device to the hydrogen radicals, as described in the first embodiment.

Figure 21:
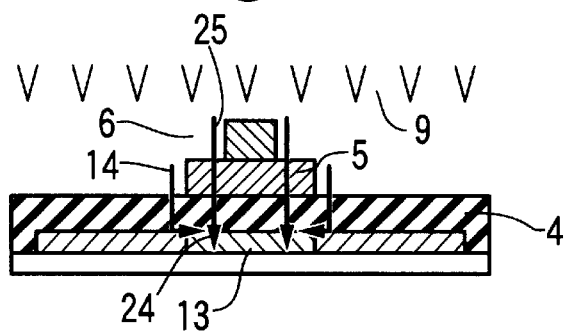
FIG. 21 is a schematic diagram showing a hydrogen diffusion state during the hydrogenation process in the polysilicon thin film transistor according to the third embodiment of the present invention.

The diffusion route of hydrogen molecules, ions or radicals in the hydrogenation process of the present invention is composed of two main routes, as shown in FIG. 21. One is a diffusion route 14 in which the hydrogen molecules, hydrogen ions or hydrogen radicals pass through the gate insulating film 4 from outside the low resistance polysilicon gate electrode. The other is a diffusion route 24 in which the hydrogen molecules, hydrogen ions or hydrogen radicals pass through the low resistance polysilicon gate electrode exposure section 25 and the gate insulating film 4 to the active region 13.

Figure 22:
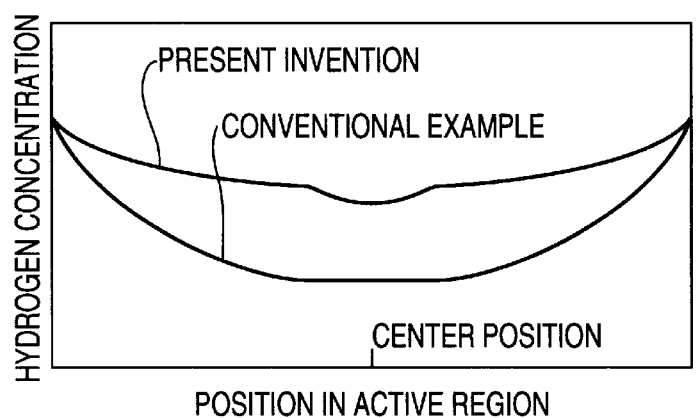
FIG. 22 is a graph showing the concentration distributions of hydrogen molecules, hydrogen ions or hydrogen radicals diffused into the polysilicon active region during the hydrogenation process in the third embodiment of the present invention and the conventional example.

The diffusion route 14 is the same as the diffusion route in the conventional example shown in FIG. 2. In this route, because the hydrogen molecules, hydrogen ions or hydrogen radicals diffuse without passing through the low resistance polysilicon gate electrode 5, there is not hydrogen loss in the low resistance polysilicon gate electrode 5. However, the distance from the end of the low resistance polysilicon gate electrode 5 to the central portion of the polysilicon active region 13 is about 2 to 3 $\mu$m or more and is long. Therefore, like the conventional example shown in FIG. 22, the hydrogen concentration becomes low in the central portion of the polysilicon active region 13. As a result, the diffusion route is insufficient for the hydrogenation process.

On the other hand, in the hydrogenation process of the present invention, there is the diffusion route 24 from above the active region. The hydrogen radicals, the hydrogen ions or hydrogen molecules diffuse through the 2-layer film with the film thickness of about 0.1 μm, i.e., the low resistance polysilicon gate electrode 5 and the gate insulating film 4, from the top portion of the active region. Therefore, a problem of the lack of the hydrogen ions, radicals or molecules in the central portion of the active region in the conventional example can be eliminated. As a result, the hydrogenation process time is possible to be made short, compared with the conventional hydrogenation process.

Last, as shown in FIGS. 20D-1 and 20D-2, an interlayer insulating film 10 is formed, contact halls 11 are opened, source and drain wiring electrodes 12 are formed. In this way, the polysilicon thin film transistor is completed.

Figures 1, 23:
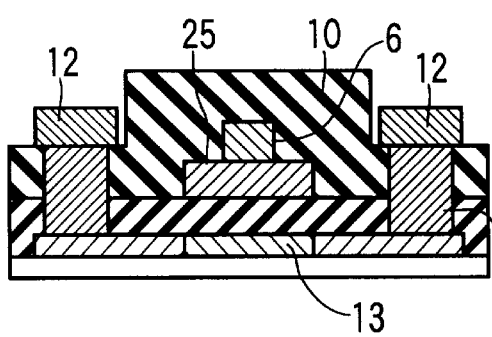
Figures 2, 23:
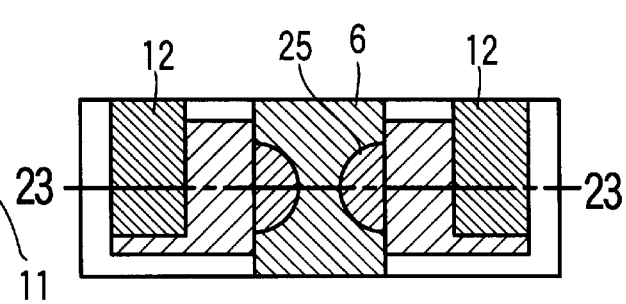

In the third embodiment, the shape of each of the low resistance polysilicon electrode exposure sections 25 is not limited to a rectangle, as shown in FIGS. 20A-1 to 20D-2. The shape of the low resistance polysilicon electrode exposure section 25 may be any shape such as a semi-circle as shown in FIGS. 23-1 and 23-2. Also, the low resistance polysilicon electrode exposure section 25 is not necessary to be formed along all the side surfaces of the gate metal/alloy electrode 6 above the polysilicon active region 13. As shown in FIGS. 24-1 and 24-2, the low resistance polysilicon electrode exposure sections 25 is sufficient to be formed along a part of the side surfaces of the gate metal/alloy electrode 6. Further, the number of low resistance polysilicon electrode exposure sections 25 above the polysilicon active region 13 may have any number as shown in FIGS. 25-1 and 25-2, and FIGS. 26-1 and 26-2.

Examples in the actual polysilicon thin film transistor will be shown below. In an N channel polysilicon thin film transistor with the channel length of 6 μm and the channel width of 6 μm, the ON current before a hydrogenation process was $1 \times 10^5$ A in the drain voltage of 12 V and the gate voltage of 12 V. When the hydrogenation process is performed to the device for 2 hours in the parallel plate plasma processor, the ON current was changed to $1 \times 10^4$ A under the same measurement condition.

When another sample was prepared in which a gate metal/alloy electrode above the polysilicon active region is etched and removed by 2 μm from both side surfaces to form low resistance polysilicon gate electrode exposure section and a hydrogenation process was performed, the ON current of $1 \times 10^4$ A was measured in the same measurement condition for the hydrogenation process of 40 minutes.

Figures 1, 27A:
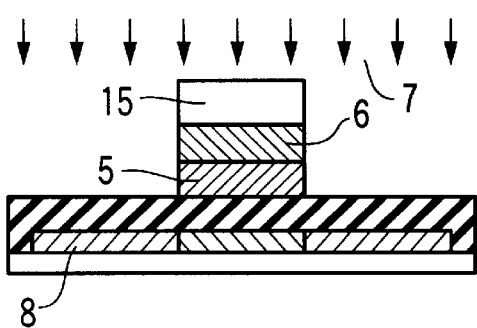
Figures 2, 27A:
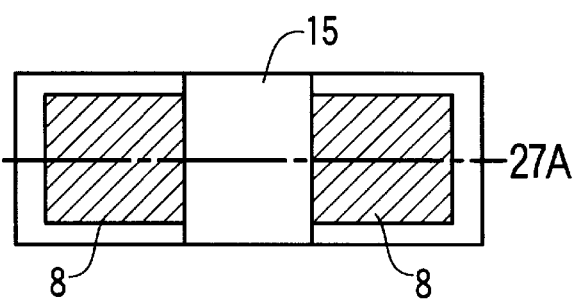

Next, the manufacturing method of the polysilicon thin film transistor according to the fourth embodiment of the present invention will be described below with reference to FIGS. 27A-1 to 27D-2. FIGS. 27A-1 to 27D-1 show the cross section views of the polysilicon thin film transistor manufactured by the method according to the second embodiment of the present invention in the channel. Also, FIGS. 27A-2 to 27D-2 show the schematic plan views of the polysilicon thin film transistor manufactured by the method according to the second embodiment of the present.

In the second embodiment, the processes until the impurity ion implantation process using the gate metal/alloy electrode as a mask are the same as those in the conventional example shown in FIGS. 1A-1 to 1D-2. Therefore, the process from the impurity ion implantation process to a device completion process are shown in FIGS. 27A-1 to 27D-2.

As shown in FIGS. 27A-1 and 27A-2, impurity ion introduction is performed by an ion implantation method or an ion doping method, using a patterned resist layer 15, a gate metal/alloy electrode 6 and a low resistance polysilicon gate electrode 5 as a mask to form source and drain regions 8. Phosphorus ions or arsenic ions are introduced in the area where an N channel transistor is formed as the impurity ions, and boron ions are introduced in the area where EL P channel transistor is formed.

Figures 1, 27B:
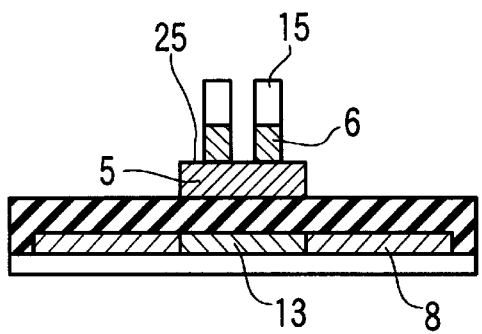
Figures 2, 27B:
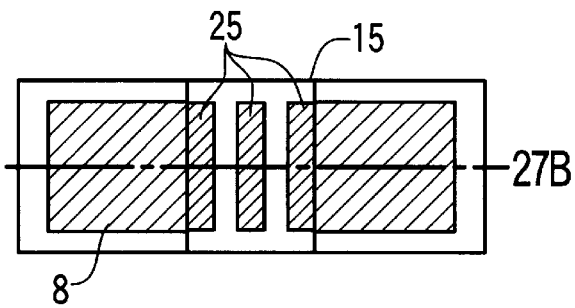

Next, as shown in FIGS. 27B-1 and 27B-2, the resist layer mask 15 is re-patterned. Then, the gate metal/alloy electrode 6 is patterned by an etching method such that two openings are formed above a polysilicon active region 13 to expose a low resistance polysilicon gate electrode 5. In this way, low resistance polysilicon electrode exposure sections 25 are formed.

Figures 1, 27C:
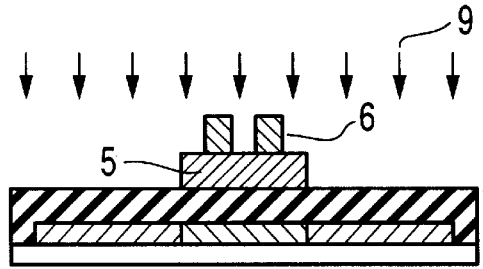
Figures 2, 27C:
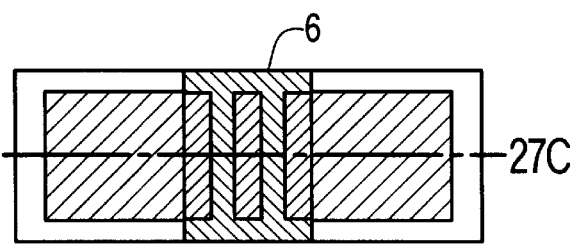
Figures 1, 27D:
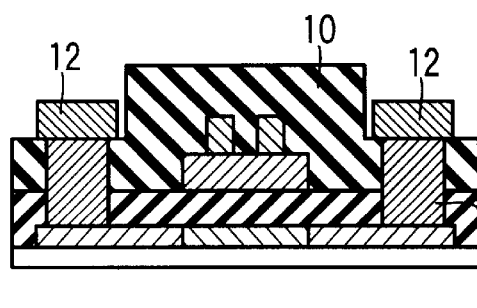
Figures 2, 27D:
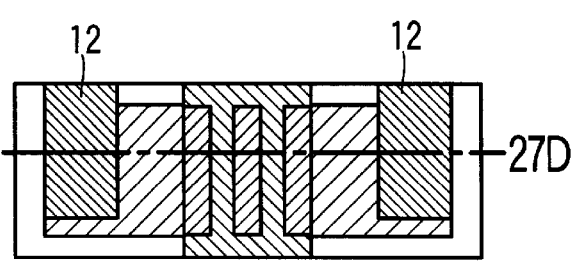

Next, as shown in FIGS. 27C-1 and 27C-2, a hydrogenation process is performed. The hydrogenation process is performed by exposing a device as a thin film transistor formed on the substrate to a hydrogen atmosphere or a hydrogen plasma atmosphere or a hydrogen radical atmosphere at the device temperature of about 200 to 400° C. As described in the first embodiment, the parallel plate plasma CVD apparatus is used to expose the device to the hydrogen plasma. Also, a remote plasma apparatus such as the parallel plate remote plasma CVD apparatus, the ECR plasma CVD apparatus and a microwave plasma CVD apparatus is used to expose the device to the hydrogen radicals, as described in the first embodiment.

Figure 28:
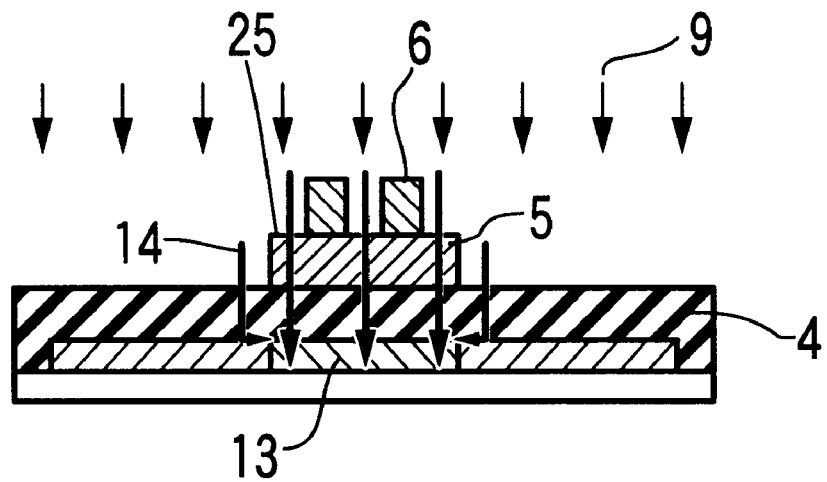
FIGS. 28 is a schematic diagram showing a hydrogen diffusion state during the hydrogenation process in the polysilicon thin film transistor according to the fourth embodiment of the present invention.
Figure 29:
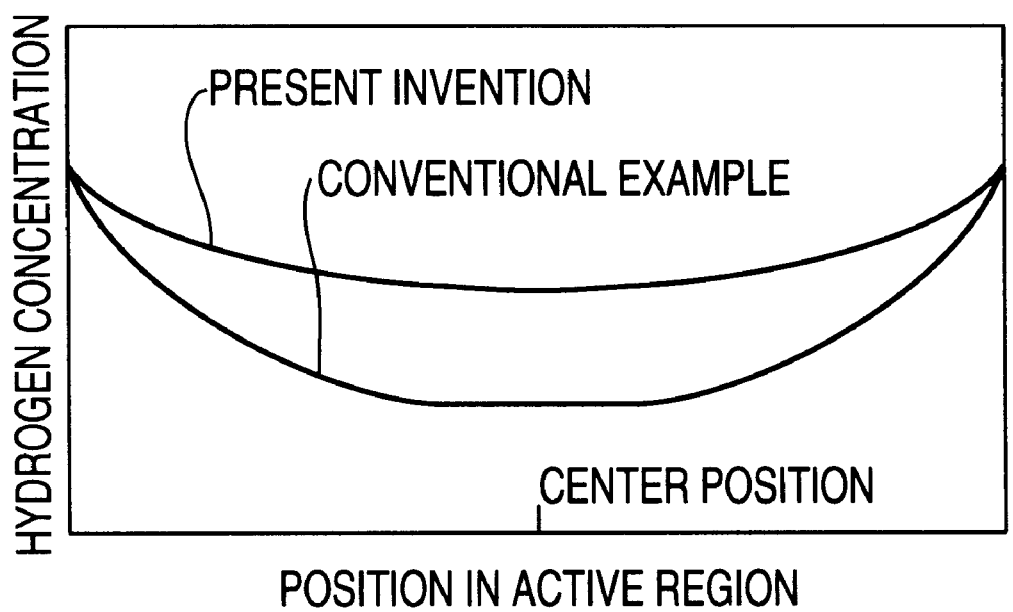
FIG. 29 is a graph showing the concentration distributions of hydrogen molecules, hydrogen ions or hydrogen radicals diffused into the polysilicon active region during the hydrogenation process in the fourth embodiment of the present invention and the conventional example.
Figures 1, 30:
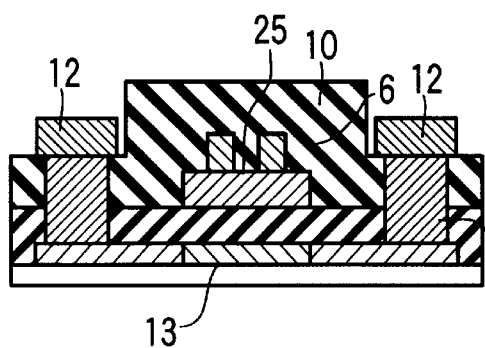
Figures 2, 30:
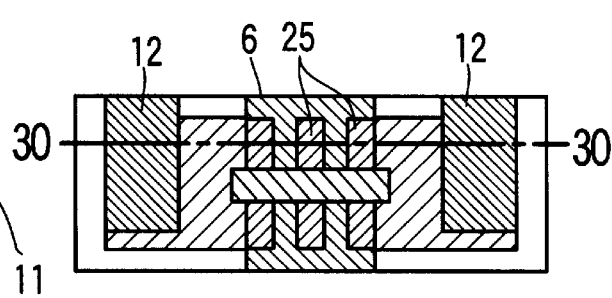
Figures 1, 31:
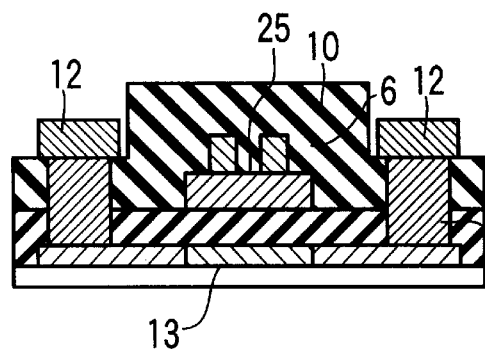
Figures 2, 31:
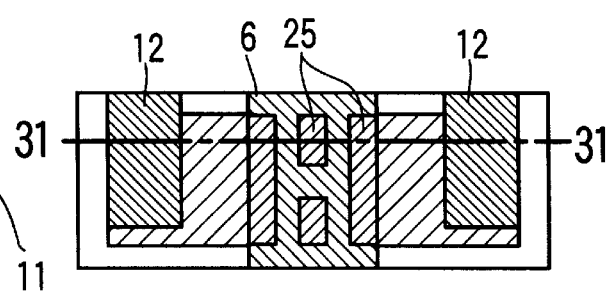
Figures 1, 32:
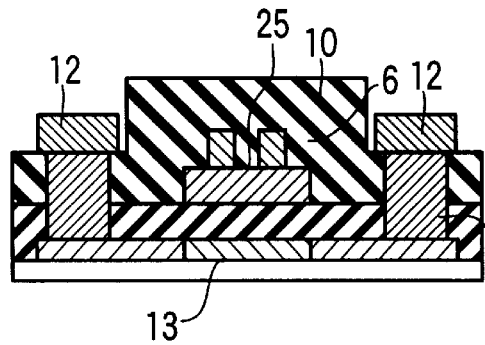
Figures 2, 32:
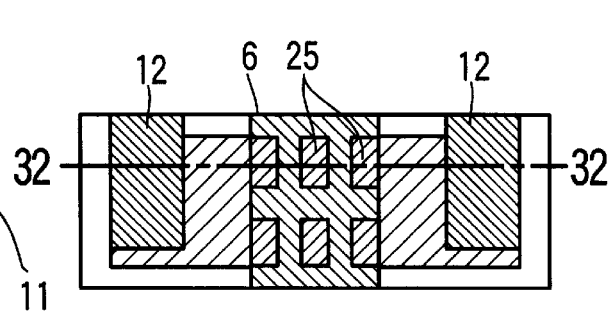
Figures 1, 33:
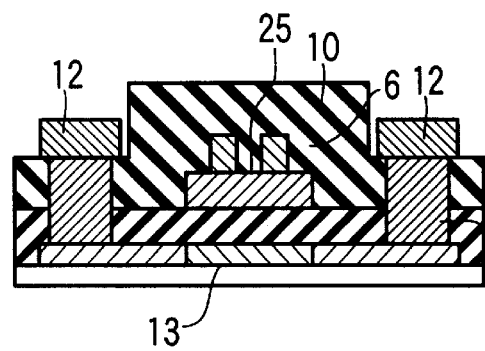
Figures 2, 33:
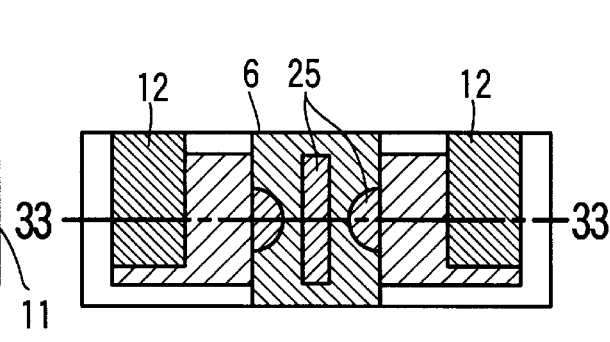

The diffusion route of hydrogen molecules, ions or radicals in the hydrogenation process of the present invention is composed of two main routes, as shown in FIG. 28. One is a diffusion route 14 in which the hydrogen molecules, hydrogen ions or hydrogen radicals pass through the gate insulating film 4 from outside the low resistance polysilicon gate electrode. The other is a diffusion route 24 in which the hydrogen molecules, hydrogen ions or hydrogen radicals pass through the low resistance polysilicon gate electrode exposure sections 25 and the gate insulating film 4 to the active region 13.

Figure 3:
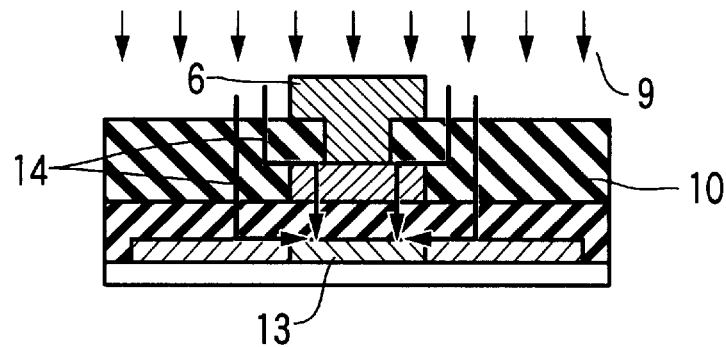
FIG. 3 is a diagram illustrating a hydrogen diffusion state in a hydrogenation process of a third conventional example of the manufacturing method.
Figure 4:
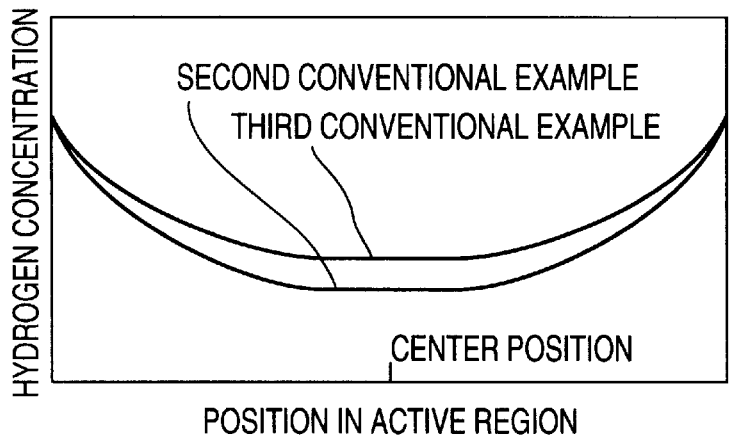
FIG. 4 is a graph which shows concentration distributions of hydrogen molecules, hydrogen ions or hydrogen radicals diffused into a polysilicon active region during the hydrogenation process in the second and third conventional examples of the manufacturing method.
Figure 5:
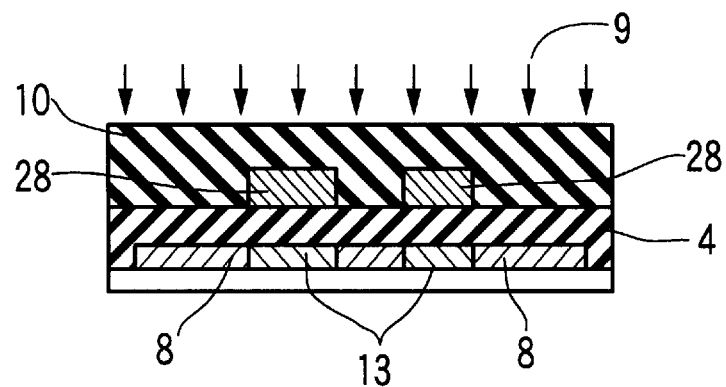
FIG. 5 is a cross sectional view of the polysilicon thin film transistor of a fourth conventional example of a manufacturing method.

The diffusion route 14 is the same as the diffusion route in the conventional example shown in FIG. 3. In this route, because the hydrogen molecules, hydrogen ions or hydrogen radicals diffuse without passing through the low resistance polysilicon gate electrode 5, there is not hydrogen loss in the low resistance polysilicon gate electrode 5. However, the distance from the end of the low resistance polysilicon gate electrode 5 to the central portion of the polysilicon active region 13 is about 2 to 3 μm or more and is long. Therefore, like the conventional example shown in FIG. 28, the hydrogen concentration becomes low in the central portion of the polysilicon active region 13. As a result, the diffusion route is insufficient for the hydrogenation process.

On the other hand, in the hydrogenation process of the present invention, the diffusion route 24 from the top portion of the active region exists. The hydrogen radicals, the hydrogen ions or hydrogen molecules diffuse through the 2-layer film with the film thickness of about 0.1 μm, i.e., the low resistance polysilicon gate electrode 5 and the gate insulating film 4, from above the active region. Therefore, a problem of the lack of the hydrogen ions, radicals or molecules in the central portion of the active region in the conventional example can be eliminated. As a result, the hydrogenation process time is possible to be made short, compared with the conventional hydrogenation process.

Last, as shown in FIGS. 20D-1 and 20D-2, an interlayer insulating film 10 is formed, contact halls 11 are opened, source and drain wiring electrodes 12 are formed. In this way, the polysilicon thin film transistor is completed.

In the fourth embodiment, the low resistance polysilicon electrode exposure sections 25 is not limited in the shapes, positions and count of the openings shown in FIGS. 27A-1 to 27D-2. The low resistance polysilicon electrode exposure sections 25 may take any shape, any position and any count as shown in FIGS. 30-1 and 30-2, FIGS. 31-1 and 31-2, FIGS. 32-1 and 32-2, FIGS. 33-1 and 33-2, and FIGS. 34-1 and 34-2.

Examples in the actual polysilicon thin film transistor will be shown below. In an N channel polysilicon thin film transistor with the channel length of 12 $\mu$m and the channel width of 12 $\mu$m, the ON current before a hydrogenation process was $1 \times 10^5$ A in the drain voltage of 12 V and the gate voltage of 12 V. When the hydrogenation process is performed to the device for 2 hours in the parallel plate plasma processor, the ON current was changed to $1 \times 10^4$ A under the same measurement condition.

When another sample was prepared in which a gate metal/alloy electrode above the polysilicon active region is etched and removed by 2 $\mu$m from both side surfaces to form the low resistance polysilicon gate electrode exposure section with the opening of 2 $\mu$m×12 $\mu$am in the central portion and a hydrogenation process was performed, the ON current of $5 \times 10^4$ A was measured in the same measurement condition for the hydrogenation process of 30 minutes.

In the above first to fourth embodiment, material of the low resistance silicon gate electrode 5 is formed of polysilicon. However, the low resistance gate electrode 5 may be formed amorphous silicon or a microcrystalline silicon.

Also, in the above first to fourth embodiment, the low resistance polysilicon gate electrode 5 and the gate metal/alloy electrode 6 which is formed of metal and/or alloy are patterned at a time using a resist layer as a mask. Then, the gate metal/alloy electrode 6 is patterned. However, another method may be employed. That is, the low resistance polysilicon gate electrode 5 is patterned using a resist layer as a mask. Subsequently, a metal/alloy layer may be formed to cover the low resistance polysilicon gate electrode 5 and then be patterned to form the gate metal/alloy electrode 6 (not shown). In this case, the gate metal/alloy electrode before the patterning can have an area larger than that of the low resistance polysilicon gate electrode 5.

In the present invention, the change of distribution of gate electric field strength which gives an MOS electric field effect and the signal delay in the wiring electrode would be afraid. However, because there is not a change in the shape of the low resistance polysilicon gate electrode, the distribution of gate electric field does not almost change.

Also, the area of the low resistance polysilicon gate electrode exposure or noncovered section, i.e., the opening or cut region of the gate metal/alloy electrode is smaller than the surface area of the gate metal/alloy electrode. Therefore, there is not almost the signal delay due to the present invention.

Figures 1, 34:
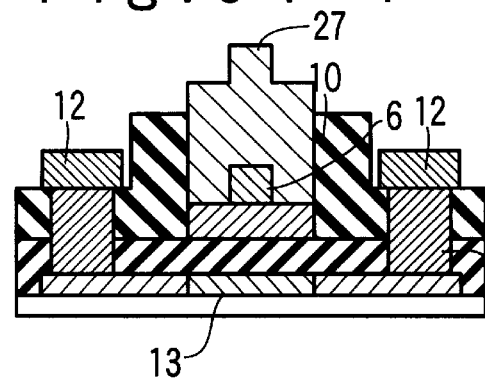
Figures 2, 34:
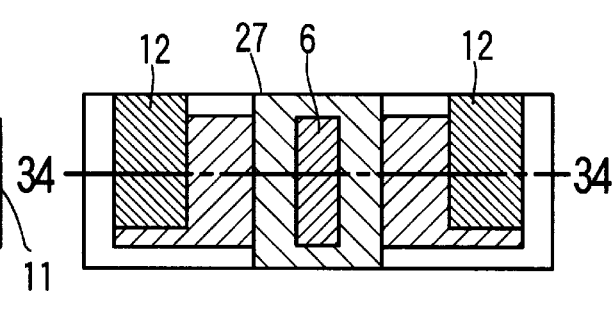

Further, in a usual device, the wiring in the thin film transistor in the fourth embodiment is often covered by the second gate metal/alloy electrode 27 as shown in FIGS. 34-1 and 34-2. In this case, there is no signal delay due to the present invention.

As described above, according to the top gate type polysilicon thin film transistor of the present invention, impurity ion implantation is performed in self-alignment using the gate electrode structure as a mask, and then activation is performed. Thereafter, the hydrogenation process is performed using the low resistance polysilicon gate electrode exposure section. Therefore, the hydrogenation process can be performed for a short time.

What is claimed is:

1. A thin film field effect transistor comprising:

source and drain regions;

an active region sandwiched by said source and drain semiconductor regions;

a gate insulating film provided to cover said source and drain regions and said active region;

a semiconductor gate formed on said gate insulating film directly above and substantially overlapping said active region, said semiconductor gate having a first portion and a second portion; and a metal/alloy gate electrode formed on said first portion of said semiconductor gate electrode such that said second portion of said semiconductor gate is not covered by said metal/alloy gate electrode, wherein at least one opening portion is formed in said metal/alloy gate electrode such that said second portion of said semiconductor gate is not covered by said metal/alloy gate electrode.

2. A thin film field effect transistor according to claim 1, wherein said semiconductor gate is formed of at least one an amorphous silicon film, a polysilicon film and a microcrystalline silicon film.

3. A thin film field effect transistor according to claim 1, wherein said semiconductor gate has a film thickness of 1 $\mu$m or below.

4. A thin film field effect transistor according to claim 1, wherein said metal/alloy gate electrode is formed of a metal film or a metal alloy film.

5. A thin film field effect transistor according to claim 1, further comprising another metal/alloy gate electrode connected to said semiconductor metal/alloy gate and said gate electrode.

* * * * *